US008524106B2

(12) United States Patent
Iversen et al.

(10) Patent No.: US 8,524,106 B2
(45) Date of Patent: *Sep. 3, 2013

(54) P-TYPE THERMOELECTRIC MATERIALS, A PROCESS FOR THEIR MANUFACTURE AND USES THEREOF

(75) Inventors: Bo Brummerstedt Iversen, Arhus C (DK); Britta Lundtoft, Mårslet (DK); Mogens Christensen, Arhus N (DK); Dieter Platzek, Muelheim-Kaerlich (DE)

(73) Assignees: Aarhus Universitet, Arhus C (DK); Deutsches Zentrum für Luft- und Raumfahrt Advanced Technology, Köln (DE)

(*) Notice: Subject to any disclaimer, the term of this patent is extended or adjusted under 35 U.S.C. 154(b) by 0 days.

This patent is subject to a terminal disclaimer.

(21) Appl. No.: 13/182,296

(22) Filed: Jul. 13, 2011

(65) Prior Publication Data

US 2011/0297872 A1 Dec. 8, 2011

Related U.S. Application Data

(62) Division of application No. 11/921,347, filed as application No. PCT/DK2006/000305 on May 31, 2006, now Pat. No. 8,003,002.

(60) Provisional application No. 60/686,240, filed on Jun. 1, 2005.

(30) Foreign Application Priority Data

May 31, 2005 (EP) .................................... 05011707

(51) Int. Cl.
*H01L 35/18* (2006.01)

(52) U.S. Cl.
USPC ....... 252/62.3 T; 136/201; 136/240; 136/239; 252/62.3 C; 252/62.3 ZB

(58) Field of Classification Search
USPC ......... 252/62.3 T, 52.3 C, 62.3 ZB; 136/201, 136/240, 239
See application file for complete search history.

(56) References Cited

U.S. PATENT DOCUMENTS

| 3,021,378 | A | | 2/1962 | Justi et al. |
| 3,086,068 | A | | 4/1963 | Charland et al. |
| 6,458,319 | B1 | * | 10/2002 | Caillat et al. ................. 420/576 |
| 8,003,002 | B2 | * | 8/2011 | Iversen et al. ............. 252/62.3 T |

FOREIGN PATENT DOCUMENTS

| JP | 2003-138327 | | 5/2003 |
| JP | 2005-005675 | | 1/2005 |
| JP | 2005-5675 | * | 6/2005 |
| WO | WO 02/089224 A1 | | 11/2002 |
| WO | WO 2005/114756 A2 | | 12/2005 |

OTHER PUBLICATIONS

Kuznetsov et al, "Solid Solution Formation in the Zn4Sb30Cd4Sb3 System", Journ. Alloys and Compounds, 372, 2004, pp. 103-106.*
Caillat, T. et al., "Zn-Sb alloys for thermoelectric power generation" Energy Conversion, Engineering Conference 1996 IECEC 96 Proceedings of the 31$^{st}$ Intersociety, Aug. 1996, pp. 905-909, vol. 2 (Abstract).
Caillat, T. et al., "Preparation and thermoelectric properties of semiconducting Zn4Sb3" Journal of Physics and Chemistry of Solids, Jul. 1997, pp. 1119-1115, vol. 58, XP-002337519 (Abstract).
Koyanagi, T. et al., "Thermoelectric properties of beta—Zn4Sb3 doped with Sn" International Conference on Thermoelectrics ICT Proceedings, 1997, pp. 463-466, XP-002337521 (Abstract).
Pedersen, B.L. et al., "Thermally stable thermoelectric $Zn_4Sb_3$ by zone-melting synthesis" Applied Physics Letters, 2008, pp. 161907-1-161907-3, vol. 92.
Pedersen, Birgitte L., et al., "Cd Substitution in $M_xZn_4$—$xSb_3$: Effect on thermal Stability, Crystal Structure, Phase Transitioins, and Thermolelectric Performance" Chem. Matter., 2010, pp. 2375-2383, vol. 22.
Psarev, et al., "Electrical Properties of Doped Single Crystals of the Compound ZN4SB3" Izvestia . . . , Tomsk RU; 1967, XP-009050478.
Record, M.C. et al., "Phase transformations in the Zn-Cd-Sb system" Intermetallics, 2003, pp. 1189-1194.
Tapiero, M. et al., "Preparation and characterization of Zn4Sb3" Solar Energy Materials, Sep.-Oct. 1985, pp. 257-274, vol. 12, XP-002337520 (Abstract).
Ugai, Ya. A. et al., "Preparation of Single Crystals of Semiconducting Phases in the Zn-Sb System" Russian Physics Journal, 1965, pp. 86-89, No. 3.
Zhang, L.T. et al., "Effect of ZnSb and Zn inclusions on the thermolectric properties of $\beta Zn_4Sb_3$" Journal of Alloys and Compounds, 2003, pp. 252-256, vol. 358.
Zhu, T.J. et al., "Transport properties of $\beta$-$Zn_4Sb_3$ prepared by vacuum melting" Journal of Zhejiang University, People's Republic of China, 2000 (Abstract).
Snyder, et al., "Disordered Zinc in $Zn_4 Sb_3$ with Phonon-glass and electron-crystal thermoelectric properties", *Nature Publishing Group*, (2004) 3:458-463.
Kuznetsov, et al., "Solid Solution Formation in the $Zn_4Sb_3$-$Cd_4Sb_3$ System," *Journal of Alloys and Compounds*, (2004) 372:103-106.

* cited by examiner

*Primary Examiner* — Carol M Koslow
(74) *Attorney, Agent, or Firm* — Knobbe Martens Olson & Bear LLP

(57) ABSTRACT

A thermoelectric material of the p-type having the stoichiometric formula $Zn_4Sb_3$, wherein part of the Zn atoms optionally being substituted by one or more elements selected from the group comprising Sn, Mg, Pb and the transition metals in a total amount of 20 mol % or less in relation to the Zn atoms is provided by a process involving zone-melting of a an arrangement comprising an interphase between a "stoichiometric" material having the desired composition and a "non-stoichiometric" material having a composition deviating from the desired composition. The thermoelectric materials obtained exhibit excellent figure of merits.

17 Claims, 21 Drawing Sheets

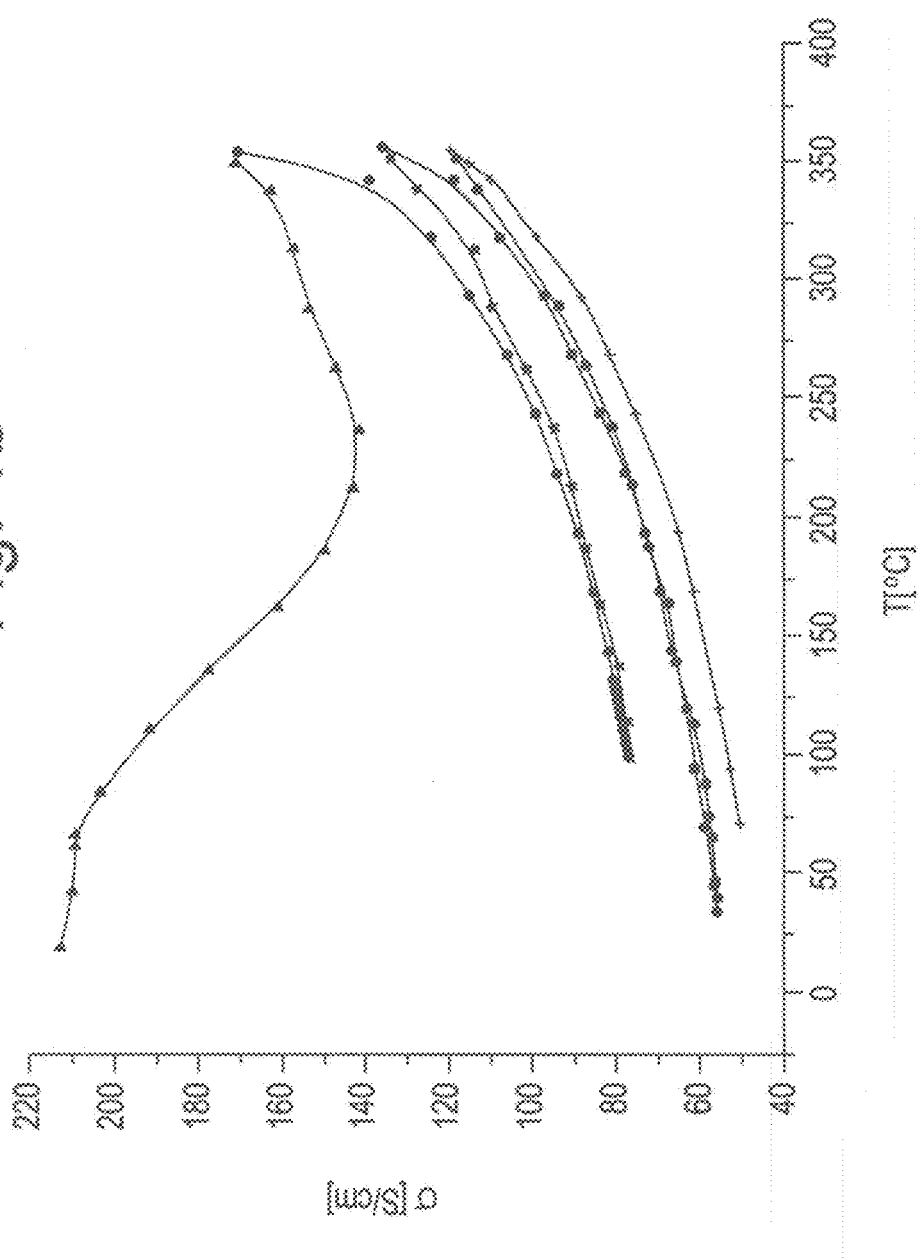

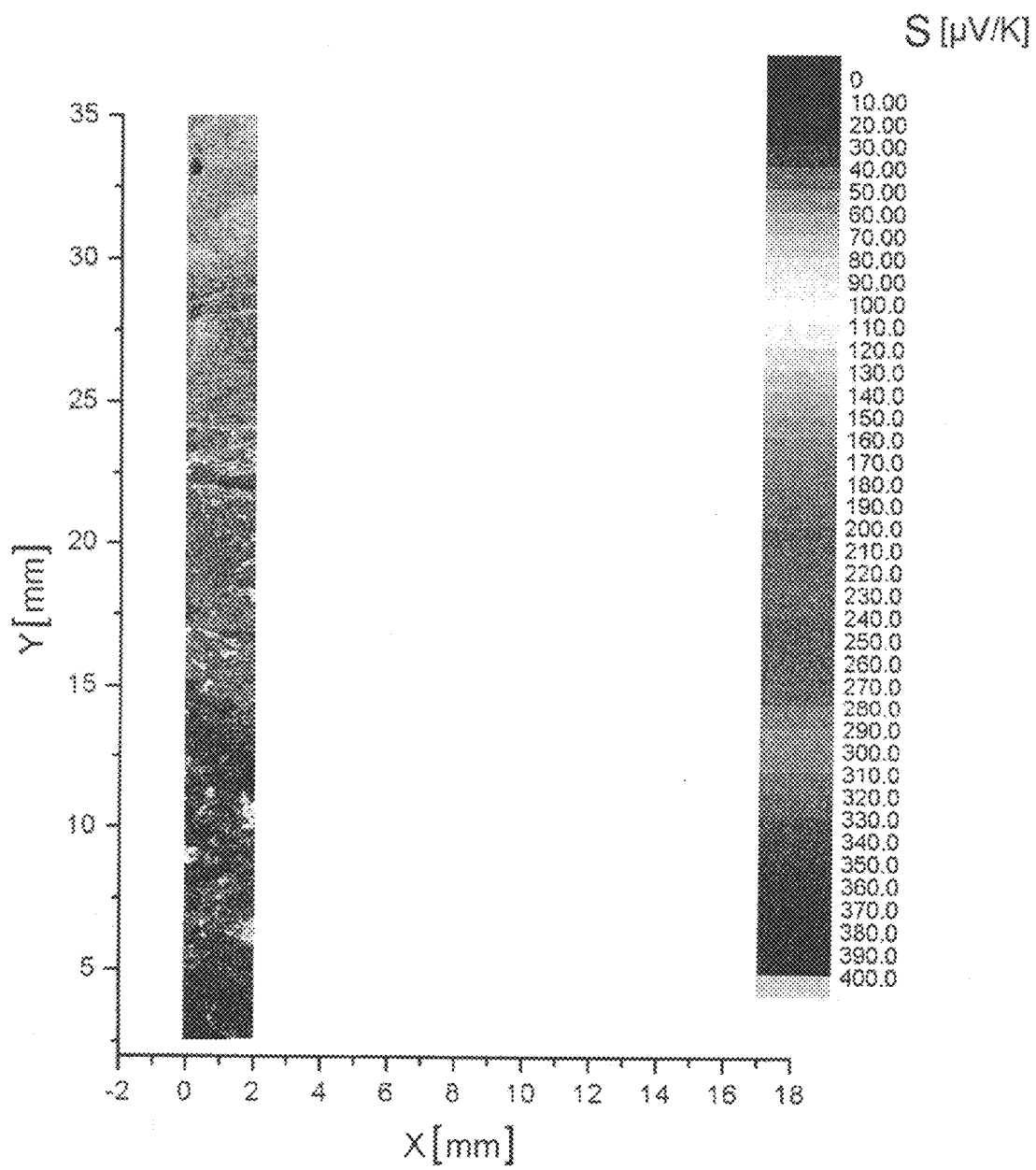

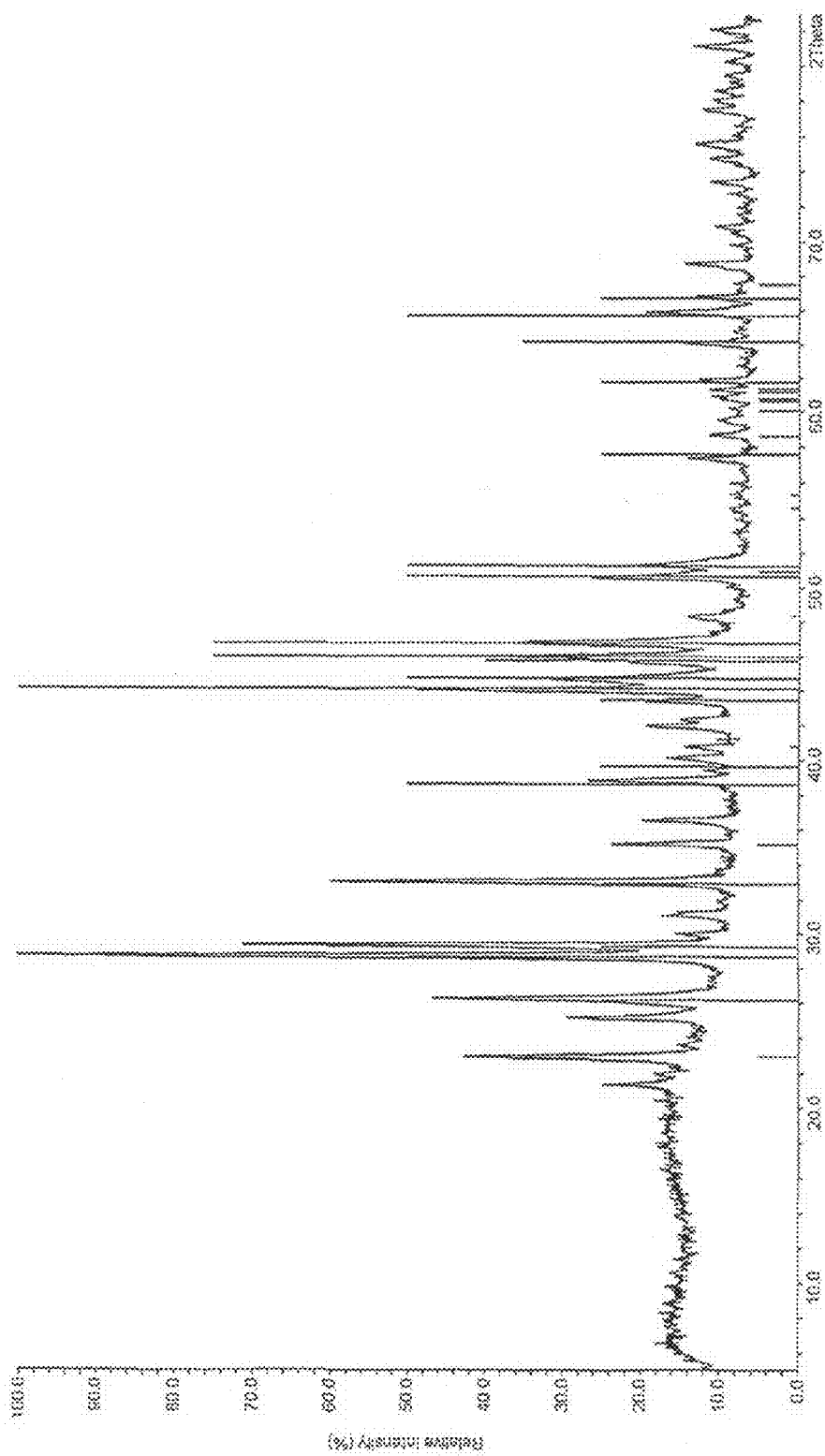

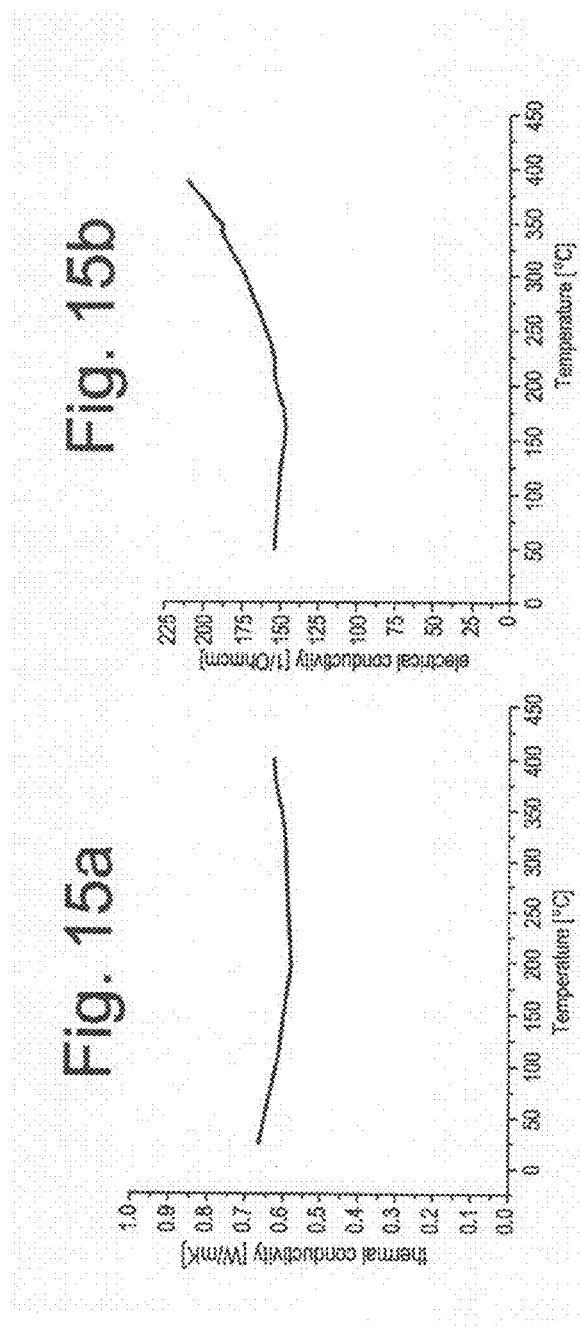
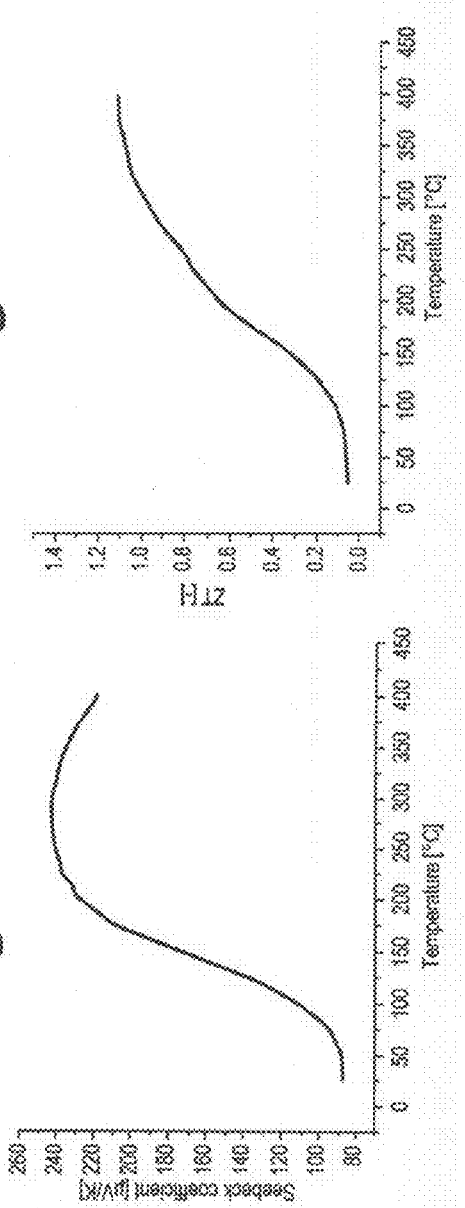
Fig. 15a  Fig. 15b  Fig. 15c  Fig. 15d

P-TYPE THERMOELECTRIC MATERIALS, A PROCESS FOR THEIR MANUFACTURE AND USES THEREOF

CROSS-REFERENCE TO RELATED APPLICATIONS

This application is a divisional of and claims the benefit of priority to U.S. patent application Ser. No. 11/921,347, filed Feb. 12, 2008, now U.S. Pat. No. 8,003,002, issued on Aug. 23, 2011, which is a National Phase application of and claims the benefit of priority to International Application PCT/DK2006/000305, filed May 31, 2006, which designated the United States and was published in English, and claims priority to U.S. Provisional Application No. 60/686,240, filed Jun. 1, 2005, and European Patent Application No. 05011707.6, filed May 31, 2005. The disclosures of all of the aforementioned applications are hereby expressly incorporated by reference in their entirety.

TECHNICAL FIELD

The present invention relates to thermoelectric materials of the p-type having the stoichiometric formula $Zn_4Sb_3$, wherein part of the Zn atoms optionally being substituted by one or more elements selected from the group comprising Mg, Sn, Pb and the transition metals.

Furthermore the present invention relates to processes for the manufacture of such improved thermoelectric materials, use of such thermoelectric materials for the manufacture of thermocouples, thermocouples comprising such thermoelectric materials, use of thermocouples for the manufacture of a thermoelectric device, thermoelectric devices comprising such thermocouples and uses of such devices for thermoelectric purposes.

BACKGROUND ART

Thermoelectric materials have been known for decades. By arranging a so-called p-type thermoelectric material and a so-called n-type thermoelectric material in couples, termed thermocouples, it is possible to convert heat into electric power or to create a temperature gradient by applying electric power.

A thermocouple accordingly comprises a p-type thermoelectric material and a n-type thermoelectric material electrically connected so as to form an electric circuit. By applying a temperature gradient to this circuit an electric current will flow in the circuit making such a thermocouple a power source.

Alternatively electric current may be applied to the circuit resulting in one side of the thermocouple being heated and the other side of the thermocouple being cooled. In such a set-up the circuit accordingly functions as a device which is able to create a temperature gradient by applying electrical power.

The physical principles involved in these above phenomena are the Seebeck effect and the Peltier effect respectively.

In order to evaluate the efficiency of a thermoelectric material a dimensionless coefficient is introduced. This coefficient, the figure of merit, ZT is defined as:

$$ZT = S^2 \sigma T / \kappa,$$

wherein S is the Seebeck coefficient, $\sigma$ is the electrical conductivity, T is the absolute temperature, and $\kappa$ is the thermal conductivity. The figure of merit, ZT is thus related to the coupling between electrical and thermal effects in a material; a high figure of merit of a thermoelectric material corresponds to an efficient thermoelectric material and vice versa.

The techniques relating to the manufacture of thermocouples from thermoelectric materials as well as the manufacture of thermoelectric devices from such thermocouples are well documented in the art. See for example Thermoelectric Handbook (ed. Rowe, M.), CRC Press, Boca Raton, 1995 and Thermoelectrics—Basic Principles and new Materials Developments, Springer Verlag, Berlin, 2001, which are hereby included as references.

Traditionally thermoelectric materials have been composed of alloys, such as $Bi_2Te_3$, PbTe, BiSb and SiGe. These materials have a figure of merit of approximately ZT=1 and operate at temperatures of 200 to 1300 K.

Further improvements appeared with the introduction of alloys of the Te—Ag—Ge—Sb (TAGS) type which exhibit ZT-values of approximately 1.2 in the temperature range of 670-720 K.

Recently new types of materials were made with alloys of the $Zn_4Sb_3$ type. Caillat et al. in U.S. Pat. No. 6,458,319 B1 disclose p-type thermoelectric materials of the formula $Zn_{4-x}A_xSb_{3-y}B_y$, wherein $0 \leq x \leq 4$, A is a transition metal, B is a pnicogen, and $0 \leq y \leq 3$. The materials are disclosed as being single phased hexagonal rhombohedral. The thermoelectric materials were manufactured as a single crystal prepared in accordance with a gradient freeze technique using a Bridgman Two-Zone furnace.

By this method however the material obtained tends to contain macro-cracks originating from the cooling of the material. Alternatively a "single phase", polycrystalline material was obtained using a powder metallurgy method in which the metals are reacted in a sealed ampoule at elevated temperature whereafter the resulting powder was hot-pressed at 20,000 psi and 350° C. The materials exhibit acceptable high figures of merit. For example U.S. Pat. No. 6,458,319 B1 discloses, that a ZT of 1 at a temperature of 250° C. could be obtained for $Zn_4Sb_3$ (cf. column 11, lines 13-16). Alternatively, the $Zn_4Sb_3$-type materials may be prepared by a quench method wherein the elements making up the composition are melted in an ampoule for 2 hours at approximately 750° C. followed by quenching in water and hot-pressing (cf. Caillat et al., J. Phys. Chem. Solids, Vol. 58, No 7, pp. 1119-1125, 1997.

The known thermoelectric materials of the composition $Zn_4Sb_3$, in which part of the Zn atoms optionally has been substituted by other dopant atoms, however has the disadvantage, that although initial high figure of merits can be obtained, these figure of merits cannot be maintained at the same level when the material is repeatedly subjected to an increase and decrease of the surrounding temperature. That is, if the thermoelectric material is thermally cycled, i.e. repeatedly subjected to an increase and decrease of the surrounding temperature, which inevitably will happen when used in thermocouples, the figure of merit will decrease with each cycle until its reach an essential stable value which is considerably lower that the initial value obtained.

This fact is also confirmed in U.S. Pat. No. 6,458,319 B1, in which it is stated that at temperature above 250° C., some decomposition occurred leading to the formation of a ZnSb crystal structure in the samples (cf. column 10, lines 17-21). Once a decomposition to ZnSb has occurred in a part of the material, the material has lost some efficiency in terms of the figure of merit. The presence of a ZnSb phase in the material will furthermore during thermal cycling make the remaining correct $Zn_4Sb_3$ phase more prone to decomposition to the undesired ZnSb phase, because the ZnSb phase already present may act as "crystal seeds" for further decomposition.

In any event, once decomposition has occurred with accompanying "loss" of figure of merit, the original figure of merit cannot be re-established and during thermal cycling it is inevitably that the figure of merit will continue decreasing until an essential constant value is obtained.

The effect of ZnSb impurities has been studied by L. T. Zhang et al. (J. Alloys and Compounds 2003, 358, 252-256, "Effects of ZnSb and Zn inclusions on the thermoelectric properties of β-$Zn_4Sb_3$") and they conclude that ZnSb and Zn impurities degrade the thermoelectric properties. In particular it is stated in this document that: "contrary to a previous paper [T. Caillat et al., J. Phys. Chem. Solids 58 (7) (1997), 1119], β-$Zn_4Sb_3$ was found to be not so stable under vacuum when heated to high temperatures, mainly because of Zn evaporation", (square bracket being added by Applicant), cf. L. T. Zhang et al. J. Alloys and Compounds 2003, 358, 252-256, page 253, paragraph 3.2, line 1).

Hence, it is evident, that the prior art $Zn_4Sb_3$ materials are not stable when subjected to thermal cycling.

Accordingly, a need for further improved thermoelectric materials of the composition $Zn_4Sb_3$, in which part of the Zn atoms optionally has been substituted by other dopant atoms and for which the decrease in the figure of merit during thermal cycling, is reduced, still exists.

Thus it is an object according to one aspect of the present invention to provide improved p-type thermoelectric materials having the stoichiometric formula $Zn_4Sb_3$, wherein part of the Zn atoms optionally being substituted by one or more elements selected from the group comprising Sn, Mg, Pb and the transition metals, and wherein the thermoelectric materials exhibit a high degree of phase purity.

A further object according to a second aspect of the present invention is to provide a process for the manufacture of such improved thermoelectric materials and to provide a method for the phase purification of an already existing thermoelectric material.

Another object according to a third aspect of the present invention is the use of such thermoelectric materials for the manufacture of thermocouples.

Yet another object according to a fourth aspect of the present invention is the provision of such thermocouples.

Still another object according to a fifth aspect of the present invention is the use of such thermocouples for the manufacture of thermoelectric devices.

Yet a still further object according to a sixth aspect of the present invention is the provision of such thermoelectric devices.

Finally as an eighth aspect of the present invention is the use of the above devices for thermoelectric purposes.

BRIEF DESCRIPTION OF THE INVENTION

The present invention relates to a thermoelectric material of the p-type having the stoichiometric formula $Zn_4Sb_3$, wherein part of the Zn atoms optionally being substituted by one or more elements selected from the group comprising Sn, Mg, Pb and the transition metals in a total amount of 20 mol % or less in relation to the Zn atoms; wherein said material in respect of ZT quality as expressed by the figure of merit, ZT, being stable after thermal cycling; and wherein said material exhibits a figure of merit, ZT of 0.5 or higher at 350° C. and/or of 0.6 or higher at 400° C.

The present invention also relates to a thermoelectric material of the p-type having the stoichiometric formula $Zn_4Sb_3$, wherein part of the Zn atoms optionally being substituted by Mg and/or Pb in a total amount of 20 mol % or less in relation to the Zn atoms.

Furthermore, the present invention relates to a process for the manufacture of a thermoelectric material according to the present invention comprising the steps:

i) arranging a rod of a "non-stoichiometric" composition consisting of Zn and Sb and one or two "feeding rods" having a composition according to the material of claim 1 in such a way that at least one interface is formed between said "non-stoichiometric" composition and said "feeding rod(s)", thereby forming an arrangement composed by said rods;

ii) placing the arrangement obtained in step i) in an enclosure and closing and preferably also evacuating said enclosure thereby forming an ampoule;

iii) placing the ampoule obtained in step ii) in a furnace, such as an induction furnace in such a way that a heating zone is positioned near the rod of the "non-stoichiometric" composition;

iv) heating the rod of the "non-stoichiometric" composition in order to start melting said rod, thereby forming a melting zone;

v) moving the arrangement relative to the heating zone in order to move the position of the melting zone of the rod arrangement in a direction towards a "feeding rod";

vi) allowing the arrangement to cool;

vii) cutting off the part(s) of the arrangement originating from the "feeding rod(s)", and grinding and hot-pressing the remaining part.

The present invention furthermore relates to a method for the phase purification of an already existing thermoelectric material and it also relates to uses of a thermoelectric material according to the present invention for the manufacture of thermocouples, such thermocouples comprising one or more p-type thermoelectric materials according to the present invention, uses of such thermocouples for the manufacture of thermoelectric devices, such thermoelectric devises and uses such thermoelectric devices for thermoelectric purposes.

BRIEF DESCRIPTION OF THE DRAWINGS

FIG. 1b shows the effect on electric conductivity during thermal cycling of a thermoelectric $Zn_4Sb_3$ material made by a process in analogy with the prior art quench method.

FIGS. 4 and 4a show the distribution of Seebeck coefficients of a zone refined $Zn_4Sb_3$ sample where the pulling speed during zone refinement of the sample was correct. The samples subjected to zone refinement was made by a process analogy with the prior art quench method.

FIG. 8 shows an x-ray powder diagram of a zone refined $Zn_4Sb_3$ sample where the pulling speed during zone refinement of the sample was too low. The sample subjected to zone refinement was made by a process in analogy with the prior art quench method.

FIGS. 15a-15d show physical data of a zone refined $Zn_4Sb_3$ sample which has not been thermally cycled. The sample subjected to zone refinement was made by a process in analogy with, the prior art quench method.

DETAILED DESCRIPTION OF THE INVENTION

The Inventive Thermoelectric Material

Figure 1A:
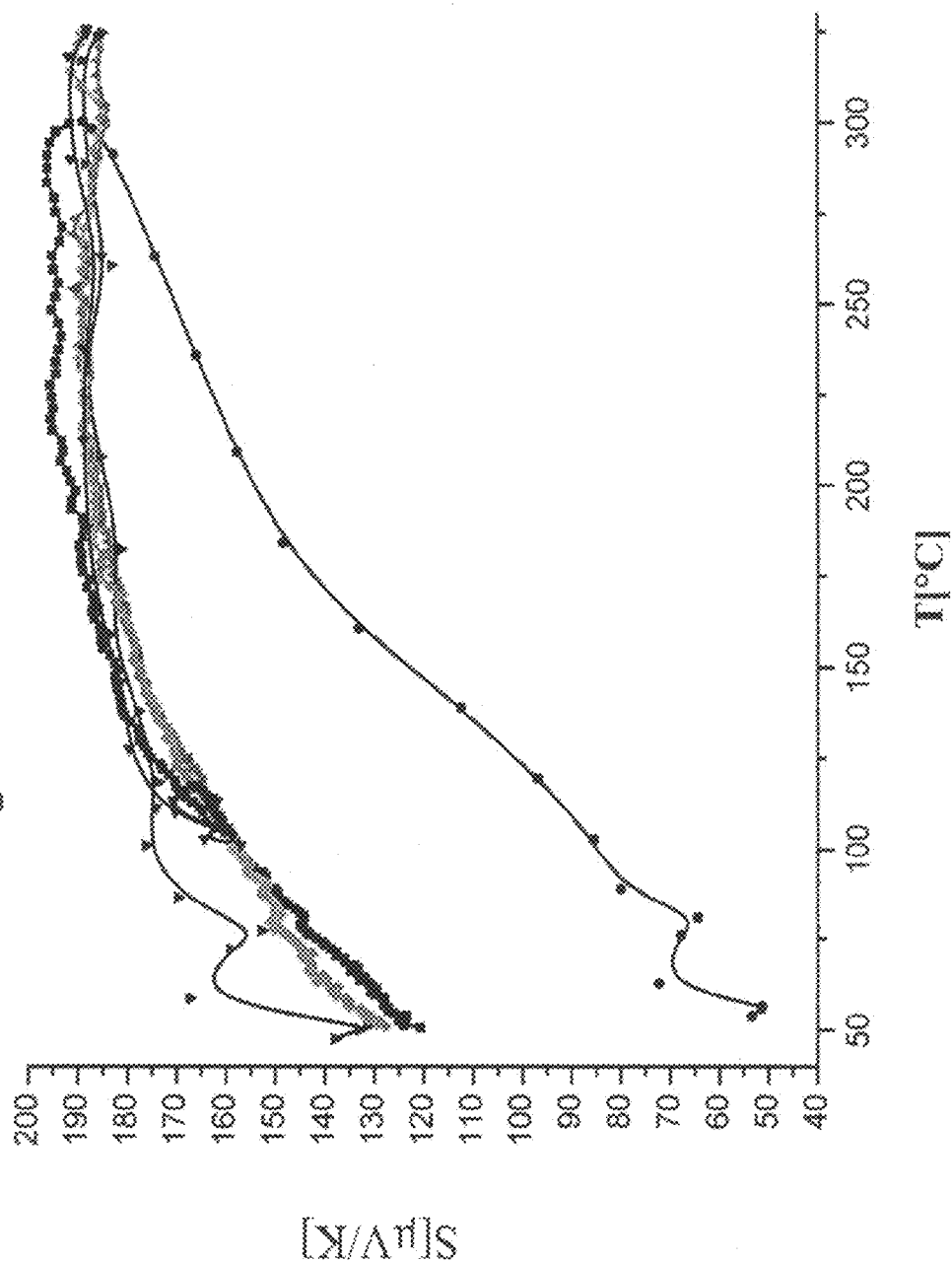
FIG. 1a shows the effect on Seebeck coefficient during thermal cycling of a thermoelectric $Zn_4Sb_3$ material made by a process in analogy with the prior art quench method.

It has now been found that the above mentioned reduction in the figure of merit under thermal cycling at least partly can be assigned to degree of phase impurities in the thermoelectric material.

According to one aspect of the present invention a thermoelectric material of the p-type having the stoichiometric formula $Zn_4Sb_3$, wherein part of the Zn atoms optionally being substituted by one or more elements selected from the group comprising Sn, Mg, Pb and the transition metals in a total amount of 20 mol % or less in relation to the Zn atoms, is provided.

The thermoelectric materials of the p-type according to the present invention are in terms of ZT quality stable after thermal cycling; and said materials exhibit a figure of merit, ZT of 0.5 or higher at 350° C. and/or of 0.6 or higher at 400° C.

The materials of the present invention have turned out to exhibit a high degree of phase purity in the sense that compared to prior art materials, the materials according to the present inventions does not contain and/or are less prone to form inclusions of the undesired ZnSb-phase.

One way of characterising the phase homogeneity of a thermoelectric material is by expressing the homogeneity in terms of a spatial Seebeck microprobe scan. The inventive materials according to the present invention may be characterised in that the material exhibits a single peak in a spatial Seebeck microprobe scan. The homogeneity of the material can be characterised via measures of the width of the single peak of the best fitted curve as expressed in the equation (i) below:

$$y = y_0 + (A/(w^*(\pi/2)^{1/2}))^* \exp(-2^*((x-xc)/w)^2) \quad \text{(i)}$$

(see section below for an explanation as to the various factors appearing in equation (i)).

Accordingly, in the present application the width, w is the width of the peak at maximum $S/\sqrt{e}$, where e is the exponential coefficient, and the materials according to the invention may be characterised in that said materials have a homogeneity as expressed by the width, w of the peak at maximum $S/\sqrt{e}$ of the best fitted curve of a spatial Seebeck scanning of 15 $\mu VK^{-1}$ or less. In the present description and in the appended claims the term "width, w of the peak at maximum $S/\sqrt{e}$" means width of the peak at the position of the height of the peak divided by $\sqrt{e}$. The reason for using this measure is that it is an appropriate measure derived from the best fitted Gauss-curve obtained from processing the measured data.

Hence in addition to x-ray powder diffraction analysis, the spatial Seebeck microprobe scan may present a useful method for evaluating on a preliminary basis, the usefulness of a potential thermoelectric material.

As set out above, the inventive thermoelectric material in addition of being of the stoichiometric formula $Zn_4Sb_3$, also comprises material of the stoichiometric formula $Zn_4Sb_3$ wherein part of the Zn atoms are substituted by one or more elements selected from the group comprising Sn, Mg, Pb and the transition metals in a total amount of 20 mol % or less in relation to the Zn atoms of $Zn_4Sb_3$.

The elements referred to as "transition elements" in the present description and the appended claims are to be understood as the group comprising the following elements: Sc, Ti, V, Cr, Mn, Fe, Co, Ni, Cu, Zn, Y, Zr, Nb, Mo, Ru, Rh, Pd, Ag, Cd, La, Hf, Ta, W, Re, Os, Ir, Pt, Au, Hg, and Ac.

The positive effect of doping a transition metal into the compound is at least two-fold. Firstly, it will lower the lattice thermal conductivity by introducing disorder in the structure. Secondly, it may introduce d-bands from the transition metal just below the Fermi level. An asymmetric band structure near the Fermi level leads to an increased Seebeck coefficient.

However, whether the thermoelectric materials according to the present invention are doped or not, it is important that they exhibit a phase diagram showing a peritectic reaction: Preferably they exhibit a phase diagram showing a peritectic reaction analogue to $Zn_4Sb_3$.

It should be noted that in the present application and in the appended claims, the term "a material having the stoichiometric formula $Zn_4Sb_3$" is to be interpreted as a material having a stoichiometry which traditionally and conventionally has been termed $Zn_4Sb_3$ and having a $Zn_4Sb_3$ crystal structure. However, it has recently been found that these materials having the $Zn_4Sb_3$ crystal structure contain interstitial zinc atoms making the exact stoichiometry $Zn_{12.82}Sb_{10}$, equivalent to the stoichiometry $Zn_{3.846}Sb_3$ (cf. Disordered zinc in Zn4Sb3 with Phonon Glas, Electron Crystal Thermoelectric Properties, Snyder, G. J.; Christensen, M.; Nishibori, E.; Rabiller, P.; Caillat, T.; Iversen, B. B., Nature Materials 2004, 3, 458-463; and Interstitial Zn atoms do the trick in Thermoelectric Zinc Antimonide, $Zn_4Sb_3$. A combined Maximum Entropy Method X-Ray Electron Density and an Ab Initio Electronic Structure Study, Caglioni, F.; Nishibori, E.; Rabiller, P.; Bertini, L.; Christensen, M.; Snyder, G. J.; Gatti, C.; Iversen, B. B., Chem. Eur. J. 2004, 10, 3861-3870). In the present application and in the appended claims the optional substitution of one or more elements selected from the group comprising Sn, Mg, Pb and the transition metals in a total amount of 20 mol % or less in relation to the Zn atoms is based on the amount of Zn atoms of the exact stoichiometry $Zn_4Sb_3$. Accordingly, the stoichiometry of a material according to the present invention having the maximum degree of substitution of metal X is $Zn_{3.2}X_{0.8}Sb_3$.

In one preferred embodiment of the present invention the inventive thermoelectric material has the stoichiometric formula $Zn_4Sb_3$.

In another preferred embodiment of the thermoelectric material according to the present invention, a part of the Zn atoms of the material having the stoichiometric formula $Zn_4Sb_3$ has been substituted with Mg.

In a further and preferred embodiment of the thermoelectric material according to the present invention, a part of the Zn atoms of the material having the stoichiometric formula $Zn_4Sb_3$ has been substituted with Cd.

In a still further and preferred embodiment of the thermoelectric material according to the present invention, a part of the Zn atoms of the material having the stoichiometric formula $Zn_4Sb_3$ has been substituted with Hg.

In a yet still further and preferred embodiment of the thermoelectric material according to the present invention, a part of the Zn atoms of the material having the stoichiometric formula $Zn_4Sb_3$ has been substituted with Pb.

In another and preferred embodiment of the thermoelectric material according to the present invention, a part of the Zn atoms of the material having the stoichiometric formula $Zn_4Sb_3$ has been substituted with Sn.

In yet a still further and preferred embodiment of the thermoelectric material according to the present invention, a part of the Zn atoms of the material having the stoichiometric formula $Zn_4Sb_3$ has been substituted with Mg; and a part of the Zn atoms has been substituted with Cd.

It should be understood that in the present application, when the thermoelectric material according to the present invention has the stoichiometric formula $Zn_4Sb_3$ wherein part of the Zn atoms is substituted by one or more elements selected from the group comprising Sn, Mg, Pb and the transition metals, the amount of the total substitution may be 20% or less, such as 19% or less, e.g. 18% or less, for example 17% or less, or 16% or less, such as 15% or less, e.g. 14% or less, for example 13% or less, or 12% or less, such as 11% or less, e.g. 10% or less, for example 9% or less, or 8% or less, such as 7% or less, e.g. 6% or less, for example 5% or less, or 4% or less, such as 3% or less, e.g. 2% or less, for example 1% or less, or not more than 0.9%, 0.8%, 0.7%, 0.6%, 0.5%, 0.4%, 0.3%, 0.2% or 0.1%; all percentages being mol %.

Furthermore, it should be understood, that when the thermoelectric material according to the present invention has the stoichiometric formula $Zn_4Sb_3$, wherein part of the Zn atoms is substituted in an amount of any of the above-mentioned percentages, the substitution may comprise any one or any combination of one or more elements selected from the group comprising Sn, Mg, Pb and the transition metals. Additionally, it should be understood that when the substitution comprises two or more elements selected from the group comprising Sn, Mg, Pb and the transition metals, the mutual molar amount of these dopant elements may be of any ratio.

Hence, the thermoelectric materials of the present invention embraces $Zn_4Sb_3$ and any combination of substitution of part of the Zn atoms of one or more elements selected from the group comprising Sn, Mg, Pb and the transition metals in any mutual molar ratio and in a total amount of substitution of any of the above percentages.

By the process for the manufacture of said thermoelectric materials according to the present invention it has been possible to obtain the above materials, in which the degree of phase purity is very high; i.e. the obtained inventive materials show only minor variations as to the possible various phases of the material.

The process according to the present invention for the manufacture of the inventive thermoelectric materials is a so-called zone melting process in which an interphase of two materials having different stoichiometries is melted and in which the obtained melted zone subsequently is moved in relation to the material so as to obtain the solidified material in a high phase purity.

It has been found that the phase purity of the thermoelectric material has a tremendous impact on the decrease of the ZT-value during thermal cycling. Thus, when obtaining thermoelectric materials according to the present invention which have a high degree of phase purity, the "loss" of the figure of merit, the ZT-value, during thermal cycling, is considerably reduced as compared to materials which have not been manufactured by a zone melting process.

The reason for this is not fully understood, but it is believed that the high purity and homogeneity prevents growth of undesired impurity phases due to the fact that only minor amounts of crystal "seeds" of undesired crystal structure are present in a material having a high degree of phase purity. A lower content of undesired crystal structures may make the material less prone to undergo a phase transition during heating and cooling cycles.

Figure 2:
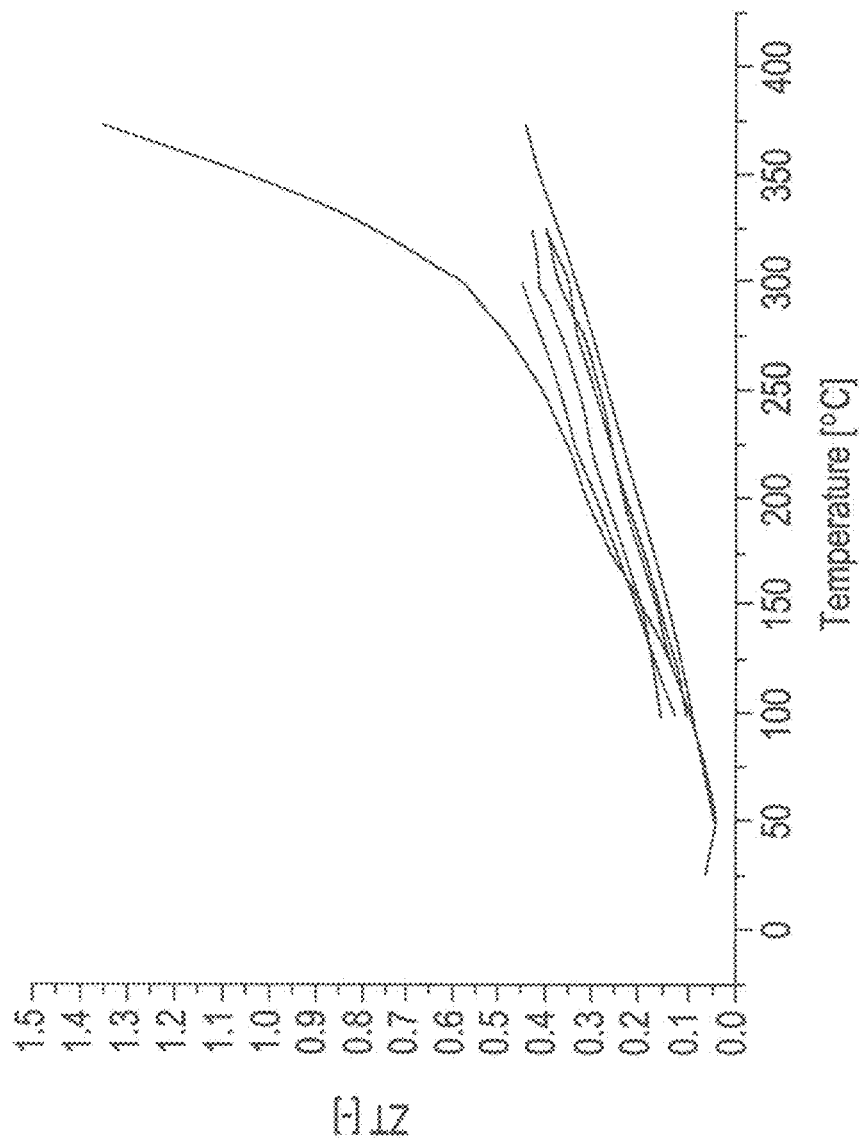
FIG. 2 shows the decrease of the ZT-value during thermal cycling. In the right hand side the curves represent from top to bottom: first heating cycle, first cooling cycle, second heating cycle, third heating cycle, second cooling cycle, third cooling cycle.

FIG. 1a, FIG. 1b and FIG. 2 show the effect of thermal cycling of a $Zn_4Sb_3$ material on the Seebeck coefficient, S, the electrical conductivity, σ, and ZT-values respectively. The material was thermally cycled within the temperature range of 50-350° C. It can be seen that when the material has been thermally cycled a few times, somewhat stable values are obtained. In FIG. 1a the lower curve corresponds to the first part of the heating cycle, and in FIG. 1b the upper curve corresponds to the first part of the heating cycle. In the right hand side of FIG. 2 the curves represent from top to bottom: first heating cycle, first cooling cycle, second heating cycle, third heating cycle, second cooling cycle, third cooling cycle.

FIGS. 15a-15d show the physical properties of a zone refined $Zn_4Sb_3$ material according to the present invention prior to thermal cycling. The sample subjected to zone refinement was made by a process in analogy with the prior art quench method. FIGS. 15a-d show that a figure of merit of above 1.1 can be obtained at approximately 400° C. and FIGS. 9a-d show the physical properties of a zone refined $Zn_4Sb_3$ material according to the present invention (upper curve) after thermal cycling. FIGS. 9a-d show that a figure of merit of approximately 0.675 can be obtained at approximately 350° C.

Figure 12:
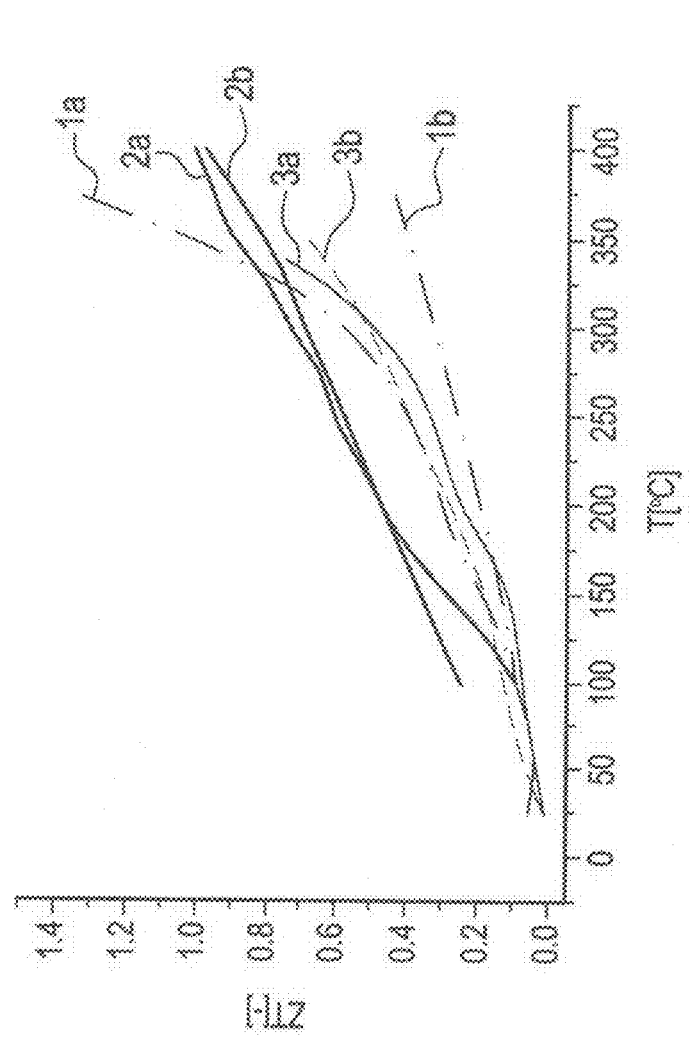
FIG. 12 illustrates the improved properties in terms of "loss" of figure of merit in respect of a zone refined $Zn_4Sb_3$ sample compared to a $Zn_4Sb_3$ sample which has not been zone refined. Curve 1a represents a $Zn_4Sb_3$ sample before thermal cycling and curve 1b represents the same sample after thermal cycling. The sample was made in analogy with a prior art quench method. Curve 3a and 3b represent a zone refined $Zn_4Sb_3$ sample measured before and after thermal cycling respectively, and curve 2a and 2b represent a zone refined $Zn_4Sb_3$ sample in which additional Zn was added during hot pressing, measured before and after thermal cycling respectively

Comparing FIGS. 15a-15d with FIGS. 9a-9d illustrates the "loss" of figure of merit during thermal cycling. FIGS. 9a-d indicate that the "loss" of figure of merit is smaller for a zone refined sample compared to a sample made by a prior art quench method. The same property of "loss" of figure of merit during thermal cycling is also illustrated in FIG. 12. FIG. 12 shows that the "loss" of figure of merit during thermal cycling in respect of a $Zn_4Sb_3$ material that was made in analogy with a prior art quench method is many times larger than the "loss" of figure of merit during thermal cycling in respect of a $Zn_4Sb_3$ material that was subjected to zone refinement (compare difference of curve 1a (quenched sample prior to thermal cycling) and 1b (quenched sample after thermal cycling) with that of curve 3a (zone refined sample prior to thermal cycling) and 3b (zone refined sample after thermal cycling) or that of curve 2a (zone refined sample with added Zn during hot pressing prior to thermal cycling) and 2b (zone refined sample with added Zn during hot pressing after thermal cycling).

The high degree of phase purity of the inventive thermoelectric materials has been confirmed by the above-mentioned spatial Seebeck microprobe scanning method (or spatial Seebeck scan for short) which is further described below.

Bearing in mind that the Seebeck-value, S is defined as dV/dT, wherein dV is the potential difference present on the material, and dT is the temperature difference present at the position of the material and that the Seebeck-value accordingly is related to the ability of a thermoelectric material to produce a potential difference when arranged in a temperature gradient, it is implied that a useful thermoelectric material must have a high S-value.

In a spatial Seebeck scanning method a cross-section of the thermoelectric material is scanned so as to obtain specific Seebeck-values for very small areas of the cross-section of the material. By plotting the distribution of Seebeck-values—i.e. by plotting the number of times a specific Seebeck-value is measured as a function of each specific Seebeck-value—the phase purity can be visualised.

If the obtained curve shows a single, sharp peak a vast majority of each small scanned area exhibits nearly the same Seebeck-value which is indicative of a high phase purity. If, on the other hand, the curve shows two or more peaks and/or if each peak is not very sharp, the scanned area of the thermoelectric material seems to be not very homogeneous as to the distribution of Seebeck-values, which is indicative of a high degree of phase impurity.

It should be noted however, that in the present application the term "peak" of a spatial Seebeck scan is to be interpreted as the peak of the best-fitted curve of the distribution of the Seebeck-values measured. This curve is obtained by fitting each accumulated Seebeck value to the following gauss equation:

$$y = y_0 + (A/(w^*(\pi/2)^{1/2}))^* \exp(-2^*((x-xc)/w)^2) \quad (i)$$

wherein $y_0$ usually is equal to 0; w is the width; x is Seebeck value, xc is peak value (=Smedium), and A is the area of the curve Accordingly, a spatial Seebeck scan may be an easy way to assess on a preliminary basis the quality of a thermoelectric material in terms of Seebeck-values, and it has been found that the inventive thermoelectric materials according to the present invention which are manufactured by the zone melting process according to the present invention exhibit a single, sharp peak in a spatial Seebeck scan having a homogeneity of 15 $\mu VK^{-1}$ or less as expressed by the width, w of the peak at maximum $S/\sqrt{e}$.

Furthermore the inventive thermoelectric materials according to the present invention which are manufactured by the zone melting process according to the present invention has improved behaviour in terms of reduction or "loss" of ZT-value during thermal cycling, as compared to thermoelectric materials which has not been made by a zone melting process.

FIGS. 9a-9d show physical data measured on a $Zn_4Sb_3$ material which has not been zone refined (a quenched material made by a process in analogy to the prior art quench method); and a zone refined $Zn_4Sb_3$ material according to the present invention respectively. The upper curve corresponds to the zone refined material. Both samples have been thermally cycled until constant values of properties were obtained. In respect of the thermal conductivity measurements the two curves are essentially superimposed. FIGS. 9a-9d show that zone refining enhances the figure of merit, ZT. At 350° C. the ZT-value is increased from 0.4 without zone refining to 0.675 when zone refined. This corresponds to an increase of approximately 0.68%.

As it appears from the above, the distribution of Seebeck-values, as obtained by a spatial Seebeck scan may in fact be utilised as a qualitative measure of the phase purity of the material. Accordingly, the distribution of the Seebeck-values in the Seebeck scan can be used for defining a given material.

Preferably, the inventive thermoelectric materials according to the present invention which are manufactured by the zone melting process according to the present invention exhibit a single, sharp peak in a spatial Seebeck scan having a homogeneity of 15 $\mu VK^{-1}$ or less as expressed by the width, w of the peak at maximum $S/\sqrt{e}$.

More preferred, the inventive thermoelectric materials exhibit a single peak corresponding to $S \geq 90\ \mu VK^{-1}$. By the term "corresponding to $S \geq 90\ \mu VK^{-1}$" it is understood that the top of the single peak corresponds to a value of S of not less than 90 $\mu VK^{-1}$ in a spatial Seebeck microprobe scan. Preferably the inventive thermoelectric materials exhibit a single peak corresponding to $S \geq 100\ \mu VK^{-1}$, such as $S \geq 110\ \mu VK^{-1}$.

It should be noted that in this application, when reference is made to a spatial Seebeck scan of a sample, it is understood that the sample is "pure" in terms of conventional x-ray powder diffraction analysis, i.e. that the total volume fraction of crystalline impurity phases is below quantification level (typically below 1-2%).

Figure 5:
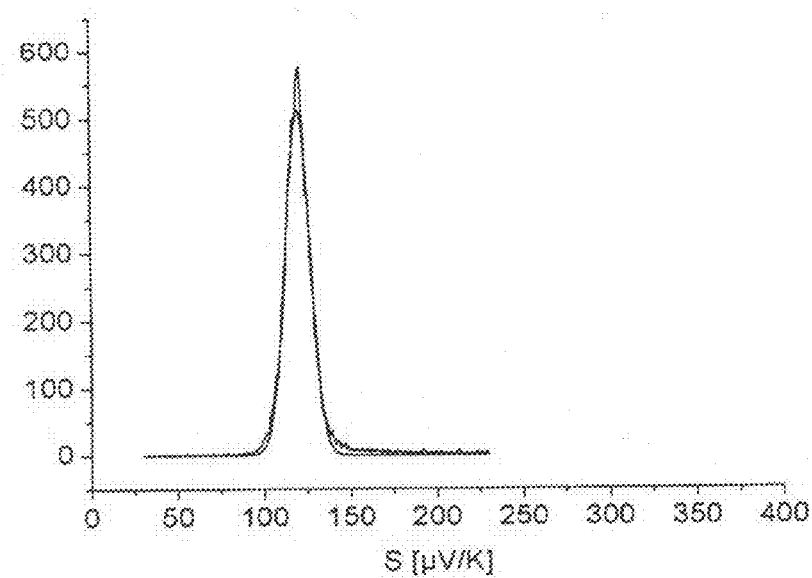
FIGS. 5-5b show the distribution of Seebeck coefficients or a zone refined $Zn_4Sb_3$ sample where the pulling speed during zone refinement of the sample was correct. The sample subjected to zone refinement was made by a process in analogy with the prior art quench method.
Figure 5A:
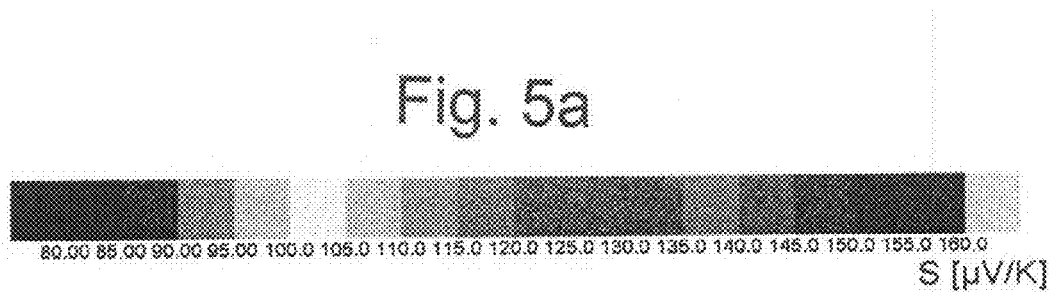
Figure 5B:
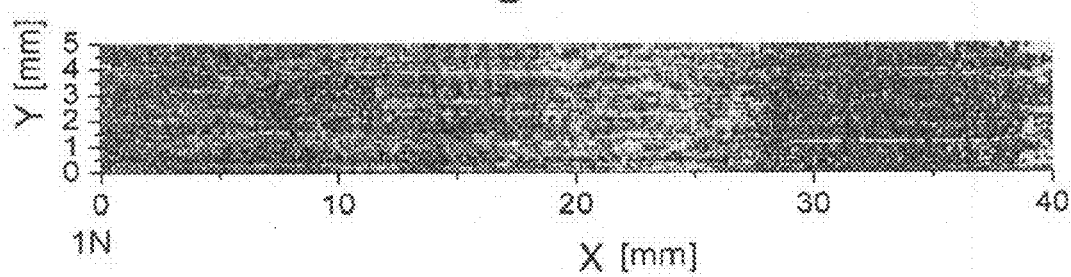

FIGS. 5-5b visualise the phase purity of a zone refined $Zn_4Sb_3$ material according to the present invention. The sample was scanned along the lengthwise direction. The curve in the upper part of FIGS. 5-5b shows the distribution or Seebeck values in respect of specific values measured, and in the plot in the lower part of FIGS. 5-5b the distribution is visualised by way of shade plotting; each shade corresponds to a specific S value. The homogeneity as expressed by the width, w was found to be 13.7 $\mu VK^{-1}$.

Figure 6:
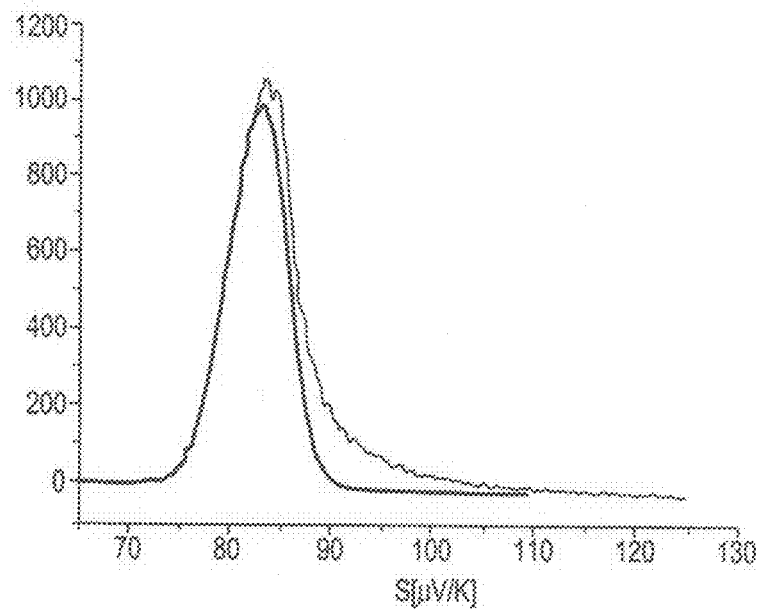
FIGS. 6-6c show the distribution of Seebeck coefficients of a zone refined $Zn_4Sb_3$ sample doped with Mg.
Figure 6A:
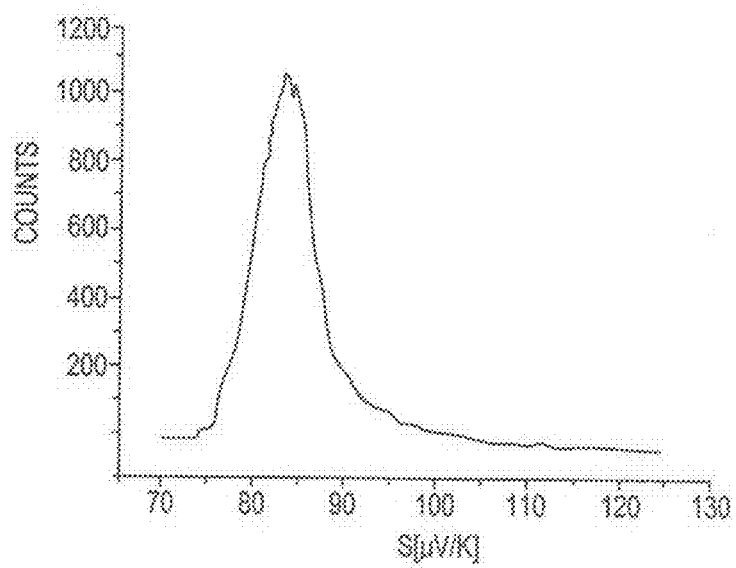
Figure 6B:
Figure 6C:
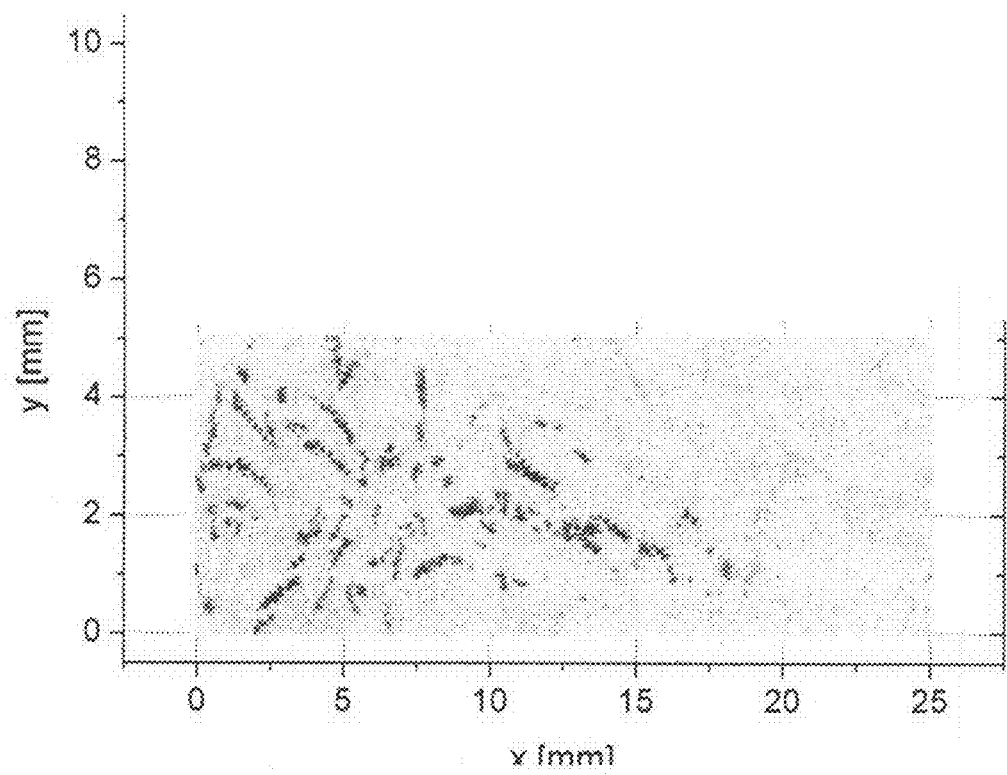

Similarly, FIGS. 6-6C visualise the phase purity of a zone refined $Zn_4Sb_3$ material doped with 1% Mg according to the present invention. The sample was scanned along the lengthwise direction. The homogeneity as expressed by the width, w was found to be 5.7 $\mu VK^{-1}$.

Figure 10:
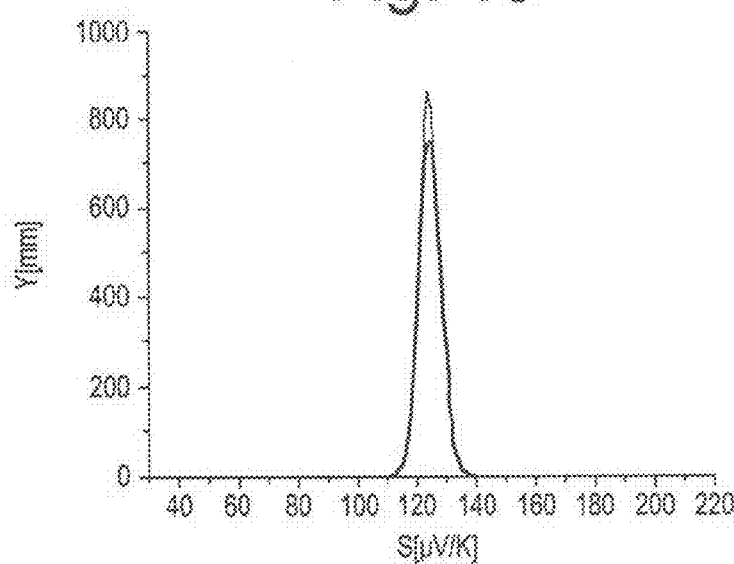
FIGS. 10-10b show the distribution of Seebeck coefficients of a quenched $Zn_4Sb_3$ sample doped with Cd.
Figure 10A:
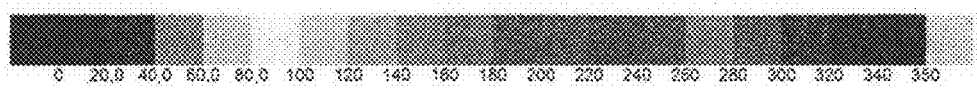
Figure 10B:
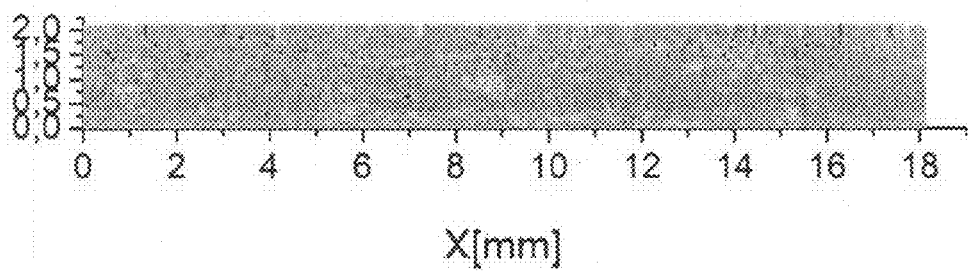

FIGS. 10-10b visualise the phase purity of a quenched $Zn_4Sb_3$ material doped with 0.1% Cd according to the present invention. The sample was scanned along the lengthwise direction. The homogeneity as expressed by the width w was found to be 6.7 $\mu VK^{-1}$.

The Spatial Seebeck Scanning Method

The following section explains how to perform the spatial Seebeck scan.

The Seebeck coefficient is an indirect measure for charge carrier concentration and thus gives information about the components of the investigated material.

A scanning Seebeck micro-thermoprobe is a device for measuring the Seebeck coefficient on a sample's surface spatially resolved, and as explained above this provides information as to the homogeneity or distribution of the components.

Figure 17:
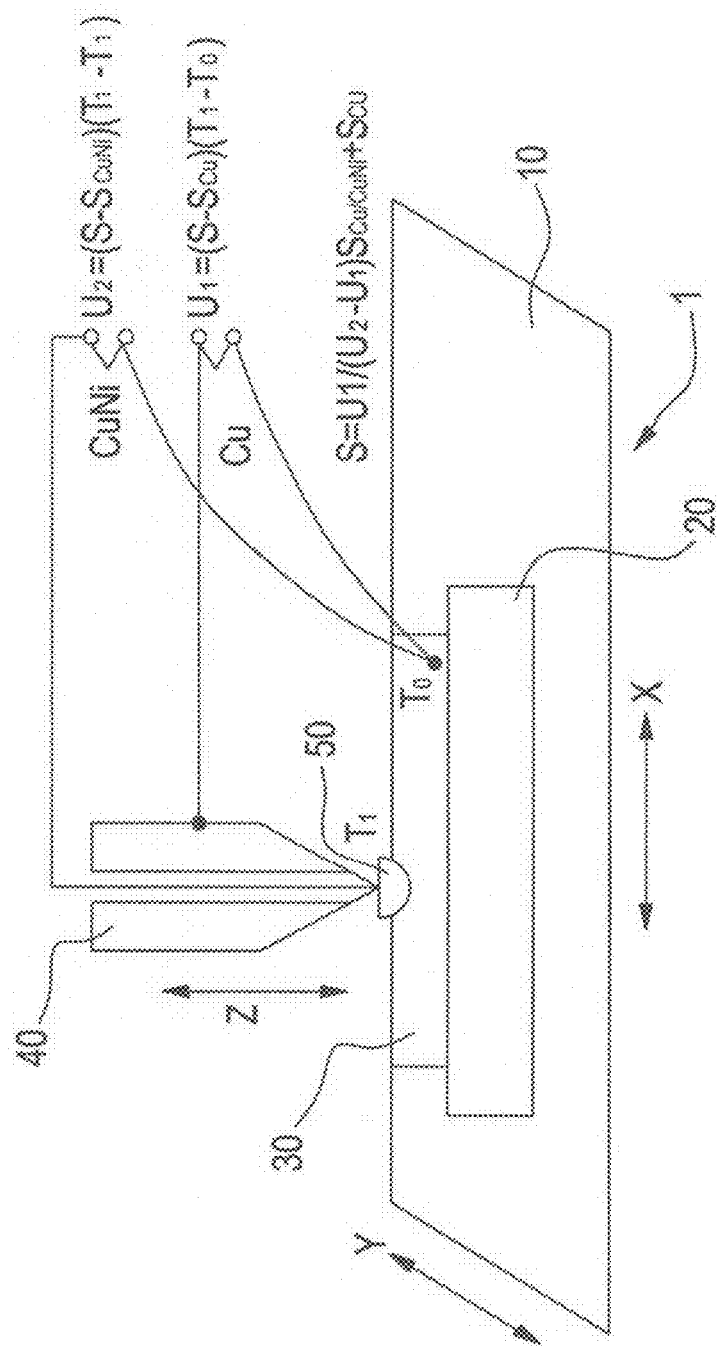
FIG. 17. shows the set-up for measuring Seebeck coefficients of a thermoelectric sample.

Measuring Principle in the Seebeck Microprobe:

With reference to FIG. 17 the microprobe for use in a spatial Seebeck scan is explained below.

A sample is divided into two halves by cutting the sample in e.g. a lengthwise direction using a diamond wire saw.

A heated probe tip (50) is positioned onto the surface of a sample (30), which due to the cutting is exposed. The probe is connected with a thermocouple (40) (in this case a Cu—CuNi type) measuring the temperature $T_1$. The sample is in good electrical and thermal contact with a heat sink (20) and also connected with a thermocouple measuring $T_0$. The probe tip (50) heats the sample in the vicinity of the tip leading to a temperature gradient. Tip (50) as well as heat sink (20) is temperature controlled and can be moved via linear stages.

Combining the Cu—Cu and the CuNi—CuNi wires of the thermocouples, voltages $U_0$ and $U_1$ are measured, resulting in the following equations:

$$U_0 = (S_S - S_{Cu}) \cdot (T_1 - T_0); \text{ and}$$

$$U_1 = (S_S - S_{CuNi}) \cdot (T_1 - T_0);$$

giving:

$$S_s = \frac{U_0}{U_1 - U_0}(S_{Cu} - S_{CuNi}) + S_{cu},$$

$S_s$ being the Seebeck coefficient of the sample at the position of the probe tip.

A major prerequisite of the measuring principle is to keep a temperature gradient between the probe and the sample. A suitable value for the gradient turns out to be around 3 K.

Three linear stages are used to scan the surface in the x-y plane (10) of the sample with a physically limited resolution of up to 10 μm depending on the thermal conductivity of the scanned material. To achieve the required high resolution, the sample must have good thermal contact to the thermocouple and a heat sink. In this case it is embedded into a low melting solder (Wood-metal) with the thermocouple.

For additional details relating to the spatial Seebeck scan, reference is made to: P. Reinshaus, H. Süβmann, M. Bohm, A. Schuck, T. Dietrich, Proc. of the 2nd European Symposium on Thermoelectrics—Materials, Processing Techniques and Applications, Dresden, Germany 1994, 90, which is hereby incorporated as reference.

Although the Seebeck measurements may depend on the calibration of a given apparatus, and thus the absolute values may vary, the relative values of the Seebeck coefficients measured for different samples on the same equipment are reliable. Because the width, w of the peak of the Seebeck scan may be used as a parameter for defining the phase purity, it is desirably that, the obtained width, w is not instrument-dependent. In fact, it has turned out, that the empirically obtained width, w will show little dependence on the exact calibration of the instrument. In other words the width w is independent on the exact absolute values measured for a given apparatus— it represents a distribution of values.

Obtaining the Figure of Merit Empirically

As set forth above, the efficiency of any thermoelectric material is characterised by the figure of merit, $$ZT = S^2 \sigma T/\kappa,$$

where S is the Seebeck coefficient, σ the electrical conductivity and κ the thermal conductivity and T is the absolute temperature.

In this work, when obtaining the figure of merit, all the factors appearing in the right hand side of the above equation were measured separately.

A—Measuring the Temperature Dependent Seebeck Coefficient S

A sample was placed into an oven and contacted with two thermocouples (Pt/PtRh) that have a distance of about 8 mm. One side of the sample is contacted with a heat sink so that a temperature gradient is created. This temperature gradient leads to the measured thermopower U(T). Derivating U(T) to the temperature gives the Seebeck coefficient at the temperature T. The thermopower was measured in a range of different temperatures.

B—Measuring the Electrical Conductivity σ

A rectangular sample was placed into an oven and contacted at both opposite faces with an AC current source. One side perpendicular to these contacts is contacted with two potential probes of tungsten carbide. The measured voltage is proportional to the electrical conductivity and the current applied to the sample and a geometrical correction factor. The voltage thus giving the electrical conductivity was measured in a range of different temperatures.

C—Measuring the Thermal Conductivity κ

The thermal conductivity κ is proportional to the density ρ, the thermal diffusivity λ and the specific heat $C_p$, $\kappa = \rho \lambda C_p$.

λ was measured with a commercial laser flash apparatus, $C_p$ was measured with a commercial DSC (differential scanning calorimeter) and the density results from the weight and the geometric dimensions. These parameters which give the thermal conductivity according to the equation given above were measured in a range of different temperatures.

All the measured parameters given above were applied according to the equation:

$$ZT = S^2 \sigma T/\kappa,$$

in order to express the figure of merit as a function of temperature.

Processes for the Manufacture of the Inventive Thermoelectric Materials

A—Zone Melting Process

The improved thermoelectric materials according to the present invention were manufactured by a zone melting process.

In this process an interphase between a "non-stoichiometric" material—i.e. a material which does not obey the stoichiometric formula of the desired thermoelectric material and a "stoichiometric" material having the stoichiometric formula of the desired material, is created so as to form an "arrangement", and subsequently a heating zone is established near or preferably around a part of the "non-stoichiometric" material so as to cause a section of the "non-stoichiometric" material to melt, whereafter the position of the melted material is moved in relation to the materials making up the arrangement in order to obtain the final product.

The interphase is preferably provided in the form of a rod of the "non-stoichiometric" material, and a "feeding rod" comprising a thermoelectric material having the stoichiometric formula which is desired for the final thermoelectric product. Preferably the arrangement is obtained by arranging one of the materials on top of the other.

In the present application the term "rod" is to be interpreted as any kind of geometrical shape which is suitable for the intended purpose, i.e. suitable for forming either the "non-stoichiometric" or the "stoichiometric" material to be melted in the zone refining process according to the present invention.

Subsequently the interphase between the two types of material is subjected to a zone melting, for example by placing this arrangement in the centre of an induction furnace. It is however preferred first to enclose the arrangement in a vacuum. This is preferably achieved by placing the arrangement in an enclosure, such as a quarts tube which subsequently preferably is evacuated and closed by melting its ends, thereby forming an ampoule. In a preferred embodiment the "non-stoichiometric" material is surrounded by two "feeding rods" thereby forming two interphases between different materials. In this embodiment—when the arrangement is arranged in an up-right configuration—the lower "feeding rod" simply acts as a support for the arrangement.

Subsequently the zone melting is started by applying power to the furnace so that the heat produced at a position corresponding to the interphase between the "nonstoichiometric" material and one feeding rod melts the material of said interphase.

When melting has been observed for about 15 min the power is slightly lowered, e.g. over a time span of approximately 10 min. After an additional time span of approximately 10 min., the ampoule is moved through the heating zone of the furnace at a very low speed, such as 0.6-1.8 mm/h. In this way the melting zone travels through the material at the same speed. When the melting zone has passed through the entire arrangement, the power is switched off and the arrangement is allowed to cool.

It has been found that when the speed of movement of the melting zone is approximately 1.0-1.5 mm/hour, the obtained zone-melted materials exhibits very high phase purities and high ZT-values as well as low "loss" of ZT-value during thermal cycling.

At this stage the part(s) of the arrangement originating from the "feeding rod(s)" is/are cut off and the remaining part is hot-pressed as set out below.

Since the crystals grown by melting and purified by zone refinement are brittle, samples were reduced to small sizes, ball milled and then hot pressed with a hot uniaxial press (HUP). The HUP consists of a vacuum chamber with an oven and a hydraulic system. Powder is filled into a pressing die of graphite that is mounted between the hydraulic plungers in the oven. The temperature and the pressure as well as the translational displacement of the plungers are controlled.

Bulk samples were prepared from powders using the hot uniaxial press (HUP). Since consolidation parameters are strongly dependent on the specific material, several tests have been performed to discover the most suitable temperature, pressure and duration for each material. A series of $Zn_4Sb_3$ samples was ground and hot-pressed at different combinations of temperature and pressure to investigate the influence of consolidation conditions on the thermoelectric properties.

Thus, a program of material consolidation has been performed to obtain the most suitable pressure, temperature and duration, which was found to be 100 MPa, 370° C. and 30 min under an inert atmosphere of 500 hPa nitrogen. All materials were ball-milled in hexane and hot pressed under vacuum. It has turned out that variations in the hot pressing parameters may account for variations in the quality of the resulting thermoelectric materials.

In some cases it was found that zinc was lost during pressing or heat treatment (probably by evaporation). In such cases it has turned out that adding zinc powder prior to HUP pressing improves the thermoelectric properties of the materials. Zinc powder—if added—was admixed in an amount of 1.2 atom % with the crushed $Zn_4Sb_3$ sample and this mixture was then ball-milled (300 rpm) in hexane for one hour and subsequently subjected to the HUP pressing using the above parameters.

FIG. 12 shows the figure of merit of thermally cycled $Zn_4Sb_3$ materials. Zone refining (curve 3b) improves the properties of a quenched (curve 1b) sample. Addition of zinc prior to the HUP (curve 2b) further increases the figure of merit.

The size of the final samples was varied between 16 mm in diameter and 1 mm in thickness for thermoelectric measurements and evaluation and 4 mm in diameter and 3-5 mm in thickness for the module preparation. Also samples with 16 mm diameter and 3 mm thickness have been prepared for module fabrication. However, the cutting of the samples may be difficult due to the brittleness of the material. 4 mm diameter samples can be used directly for the module.

Figure 3A:
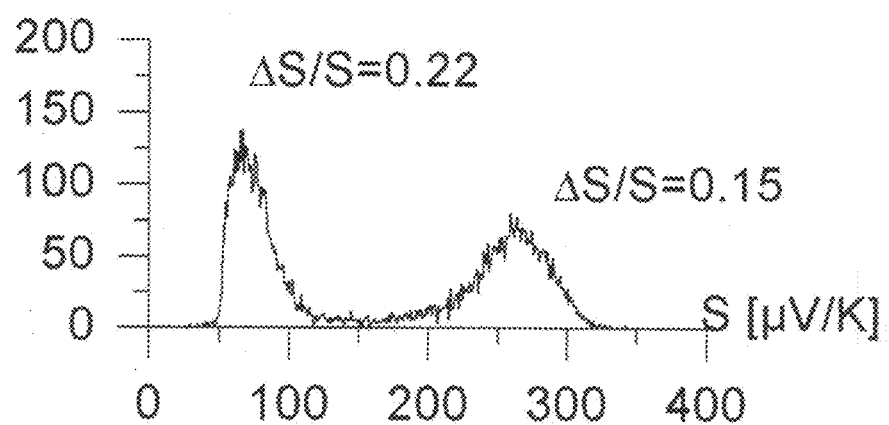
FIGS. 3a-3b1 show the distribution of Seebeck coefficients of a zone refined $Zn_4Sb_3$ sample where the pulling speed during zone refinement of the sample was too high. The sample subjected to zone; refinement was made by a process in analogy with the prior art quench method.
Figures 1, 3A:
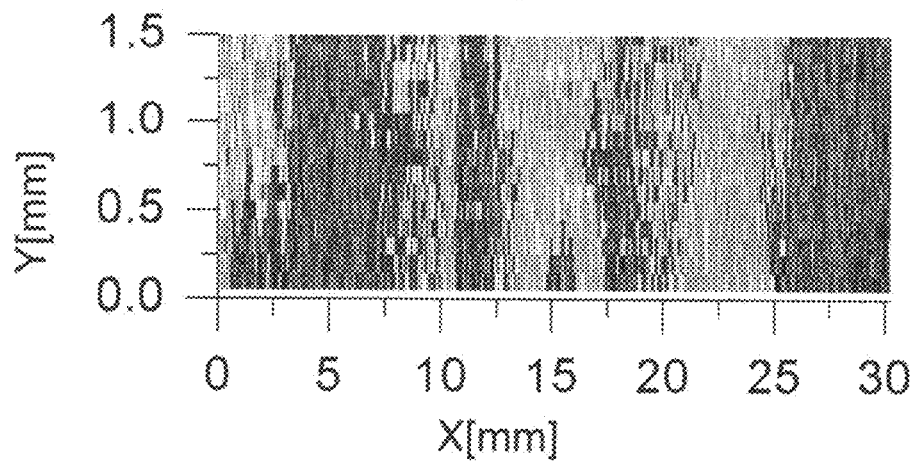
Figures 2, 3A:
Figures 3, 3A:
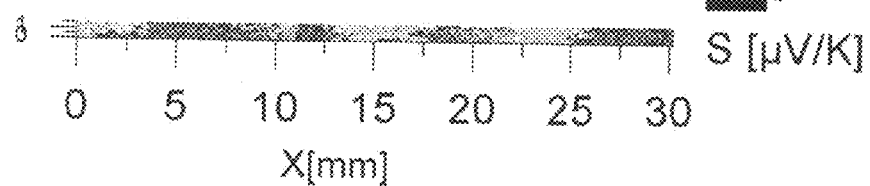

The importance of the choice of pulling speed in the zone refining method according to the present invention are illustrated by FIGS. 3a, 3b, 4, 5, 7, 8 and 14:

FIG. 3a shows the phase purity of a zone refined $Zn_4Sb_3$ material in which the pulling speed during zone refinement was too high. The sample was scanned along the lengthwise direction. Besides of being impure in terms of the various shades in the shade plotting, the sample also shows impurity in terms of exhibiting two peaks in the scan, suggesting the presence of two different phase structures.

Figures 1, 3B:
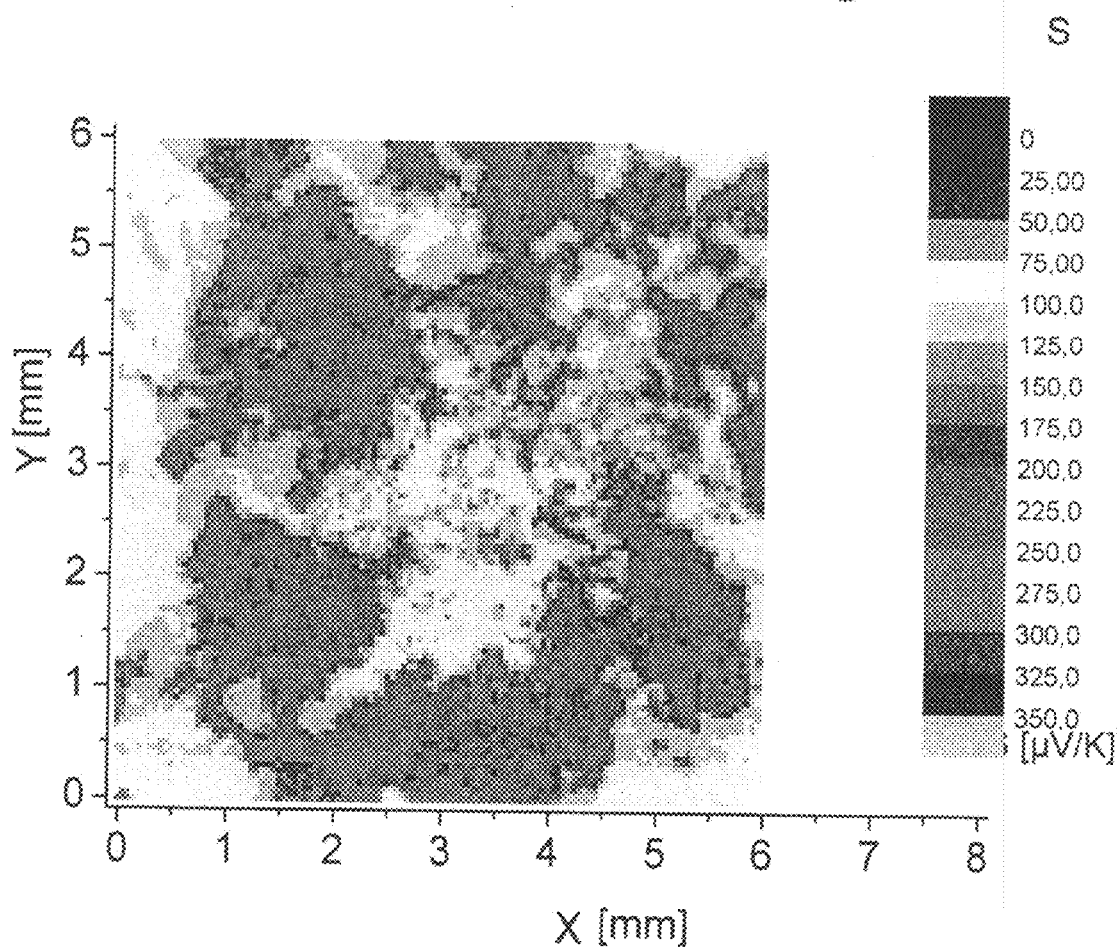

FIG. 3b shows the phase purity of the same sample. The sample was scanned in two dimensions of a cross section.

Similarly, FIG. 4 shows the phase purity of a zone refined $Zn_4Sb_3$ material in which the pulling speed during zone refinement was too low.

In contrast, FIGS. 5a-5d show the phase purity of a zone refined $Zn_4Sb_3$ material in which the pulling speed during zone refinement was correct (1.2 mm/hour). The sample was scanned along the lengthwise direction. The sample has a purity as expressed by the width, w of the peak at maximum S/√e of 13.7 $\mu VK^{-1}$.

Figure 7:
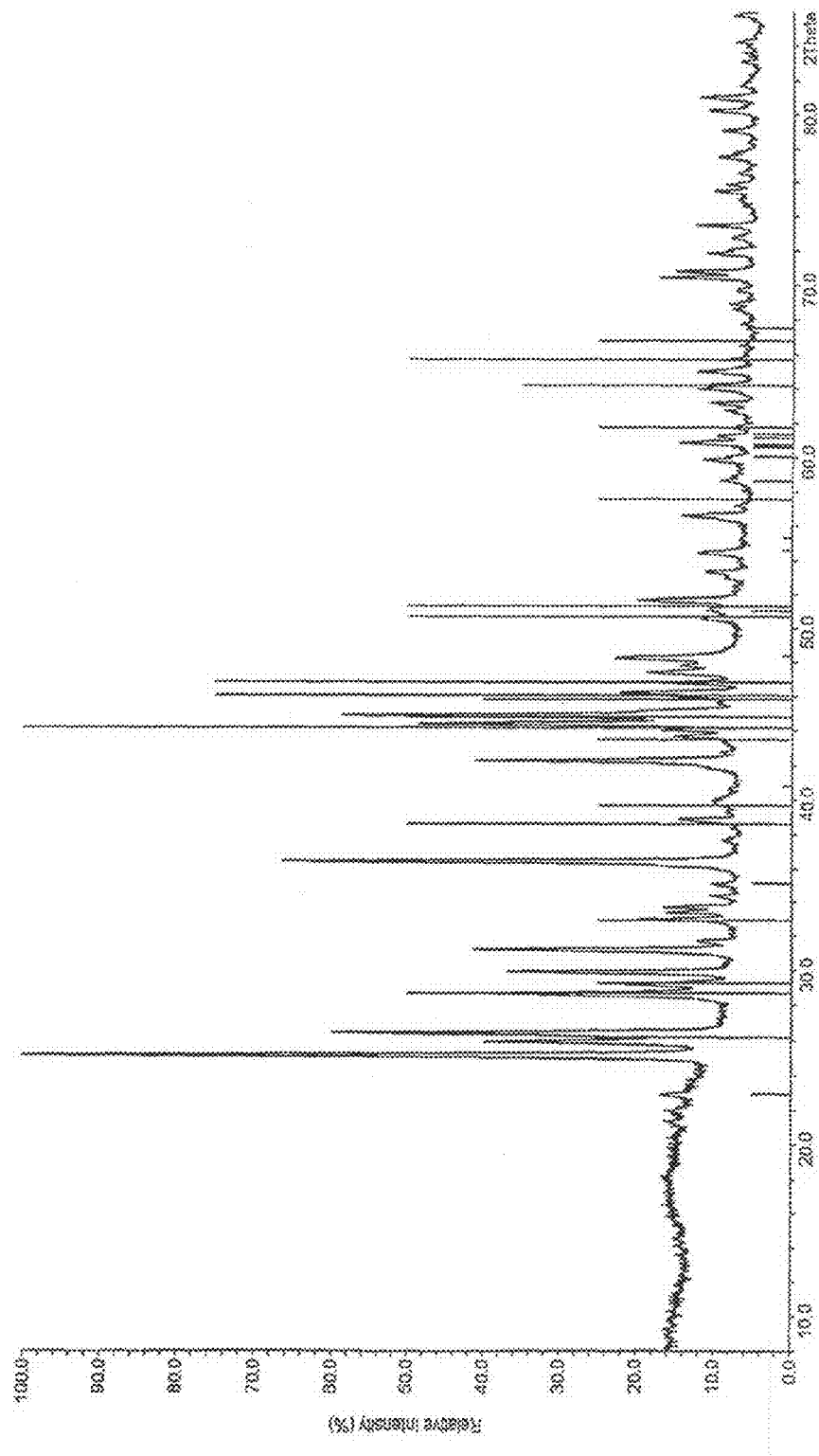
FIG. 7 shows an x-ray powder diagram of a zone refined $Zn_4Sb_3$ sample where the pulling speed during zone refinement of the sample was too high. The sample subjected to zone refinement was made by a process in analogy with the prior art quench method.
Figure 9A:
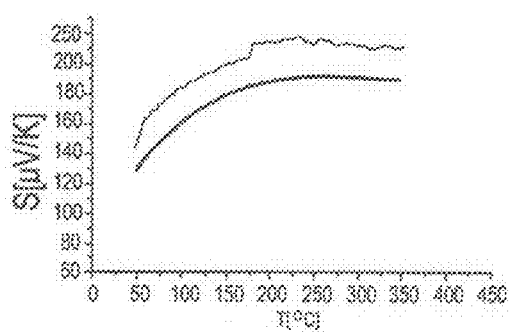
FIGS. 9a-9d show physical data of a quenched (lower curve) and a zone refined (upper curve) $Zn_4Sb_3$ sample respectively which have both been thermally cycled. The $Zn_4Sb_3$ quenched material was made by a process in analogy with the prior art quench method.
Figure 9B:
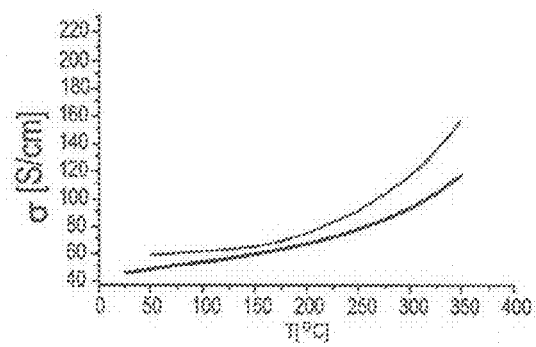
Figure 9C:
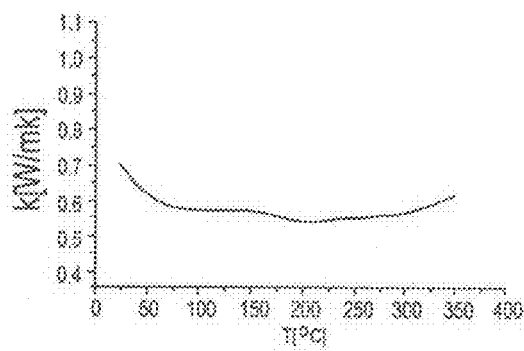
Figure 9D:
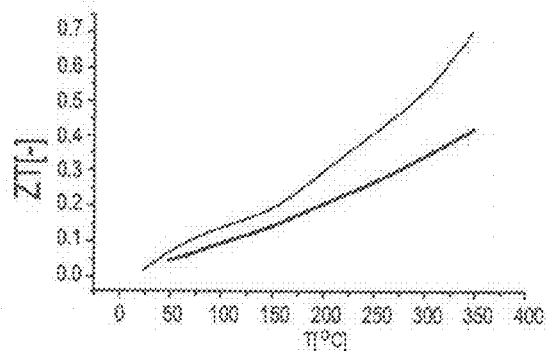

FIG. 7 and FIG. 8 are x-ray powder diffraction diagrams of zone refined $Zn_4Sb_3$ materials in which the pulling speed during zone refinement was too high and too low respectively (the continuous spectrum shows the measured data). The lines in the diagram correspond to the ZnSb impurity phase implying that too high and too low pulling speeds respectively in the zone refining methods result in ZnSb-phases in the final material.

Figure 14:
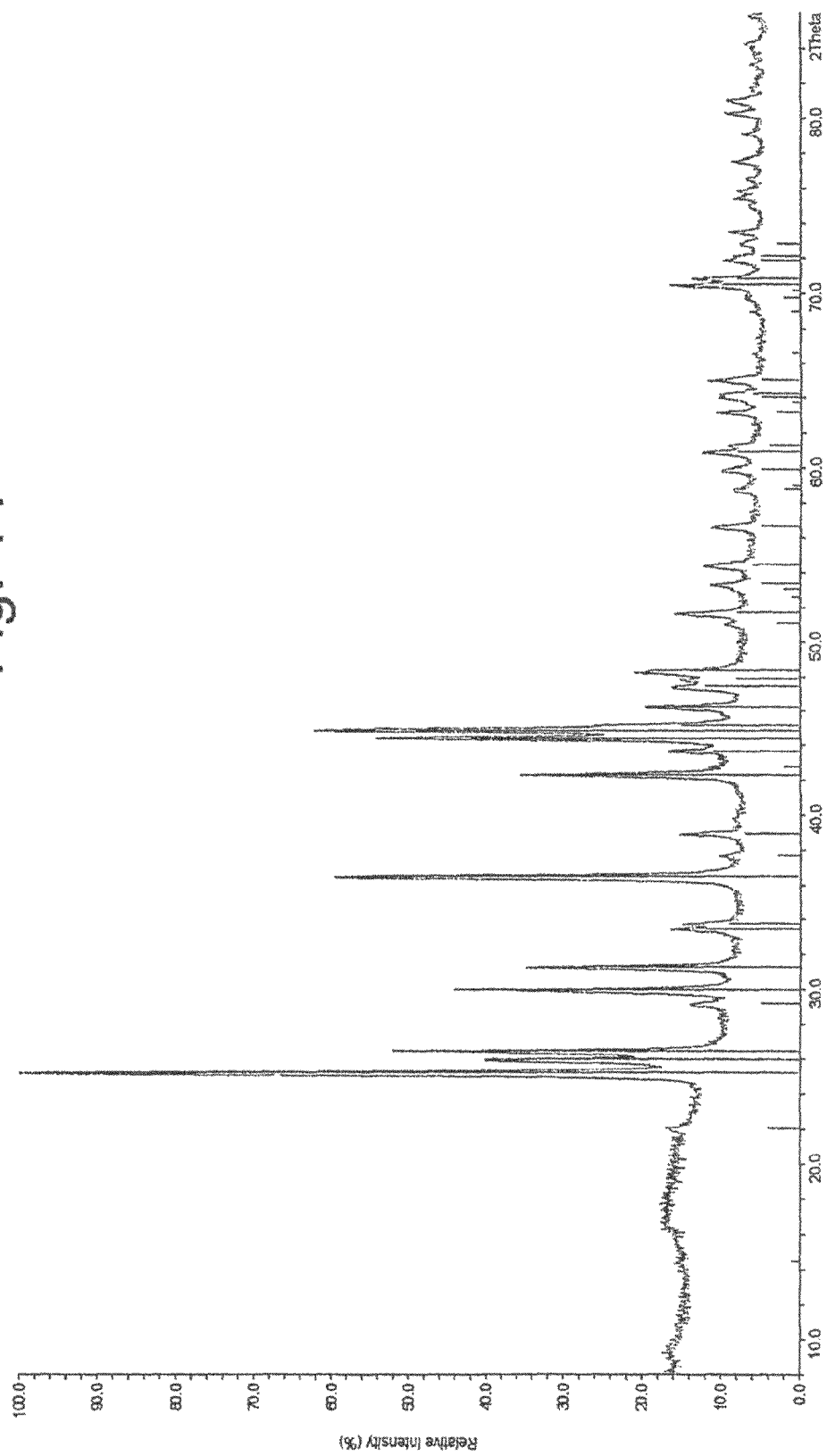
FIG. 14 shows an x-ray powder diagram of a zone refined $Zn_4Sb_3$ sample.

In contrast FIG. 14 is an x-ray powder diffraction diagram of a zone refined $Zn_4Sb_3$ material in which the pulling speed during zone refinement was correct (the continuous spectrum shows the measured data). The lines in the diagram correspond to the $Zn_4Sb_3$ phase, and correspondence between the lines and the continuous spectrum suggests that a correct pulling speed in the zone refining method results in the correct $Zn_4Sb_3$ phase in the final material. The sample of FIG. 14 was made by a process in analogy with the prior art quench method followed by zone refinement and hot pressing.

B—Preparation of the "Feeding Rods" for Use in the Zone Melting Process

Process for the Manufacture of "Feeding Rods"

According to one aspect of the present invention the "feeding rods" for use in the zone melting process may be obtained by a simple thermal quench process in analogy with the prior art quench method (cf. Caillat et al., J. Phys. Chem. Solids, Vol. 58, No 7, pp. 1119-1125, 1997).

In this process Zn pellets, Sb and optionally substituents (selected from the group comprising Mg, Sn, Pb and the transition metals) in the desired mutual molar ratio, i.e. the ratio which is desired for the final thermoelectric material, are mixed and placed in an enclosure, such as a quartz tube. Preferably the Zn pellets prior to mixing with the other components are rinsed in dilute acid, such as dilute HCL, for example 4M HCl, whereafter they preferably are rinsed in water followed by ethanol and dried with e.g. a hair dryer.

Subsequently the tube is evacuated and closed by melting, thereby resulting in a quarts ampoule. The tube is evacuated to a final pressure of $10^{-5}$ bar or less, or $10^{-3}$ bar or less. The obtained ampoule is then placed in a rotation device inside a furnace, such as a tube furnace. The furnace is switched on, and the ampoule is rotated so as to ensure mixing and homogenous heating. Preferably the ampoule is heated from room temperature to approximately 700° C. at 200-400° C./h. After a few hours, such as 1-3 hours, preferably 2 hours at this temperature, the ampoule is quickly placed in a vessel containing water for thermal quenching.

It has in fact been found, that when the quench process is carried out in respect of a material that has been doped with Mg and/or Cd and possibly also with other dopants, such as Pb, according to the thermoelectric material according to the present invention, thermoelectric materials are obtained which exhibit excellent properties in terms of ZT-values and phase purity as expressed by the spatial Seebeck microprobe scanning, even without the zone melting process, which however will further improve the properties of these materials. The same is true in respect of undoped $Zn_4Sb_3$ material; albeit this material when not zone refined exhibits a smaller degree of phase purity compared to the doped materials.

Thus one aspect according to the present invention relates to a process for the manufacture of a thermoelectric material according to the present invention comprising the steps necessary for the manufacture of the "feeding rods" followed by grinding and HUP pressing.

Figure 13:
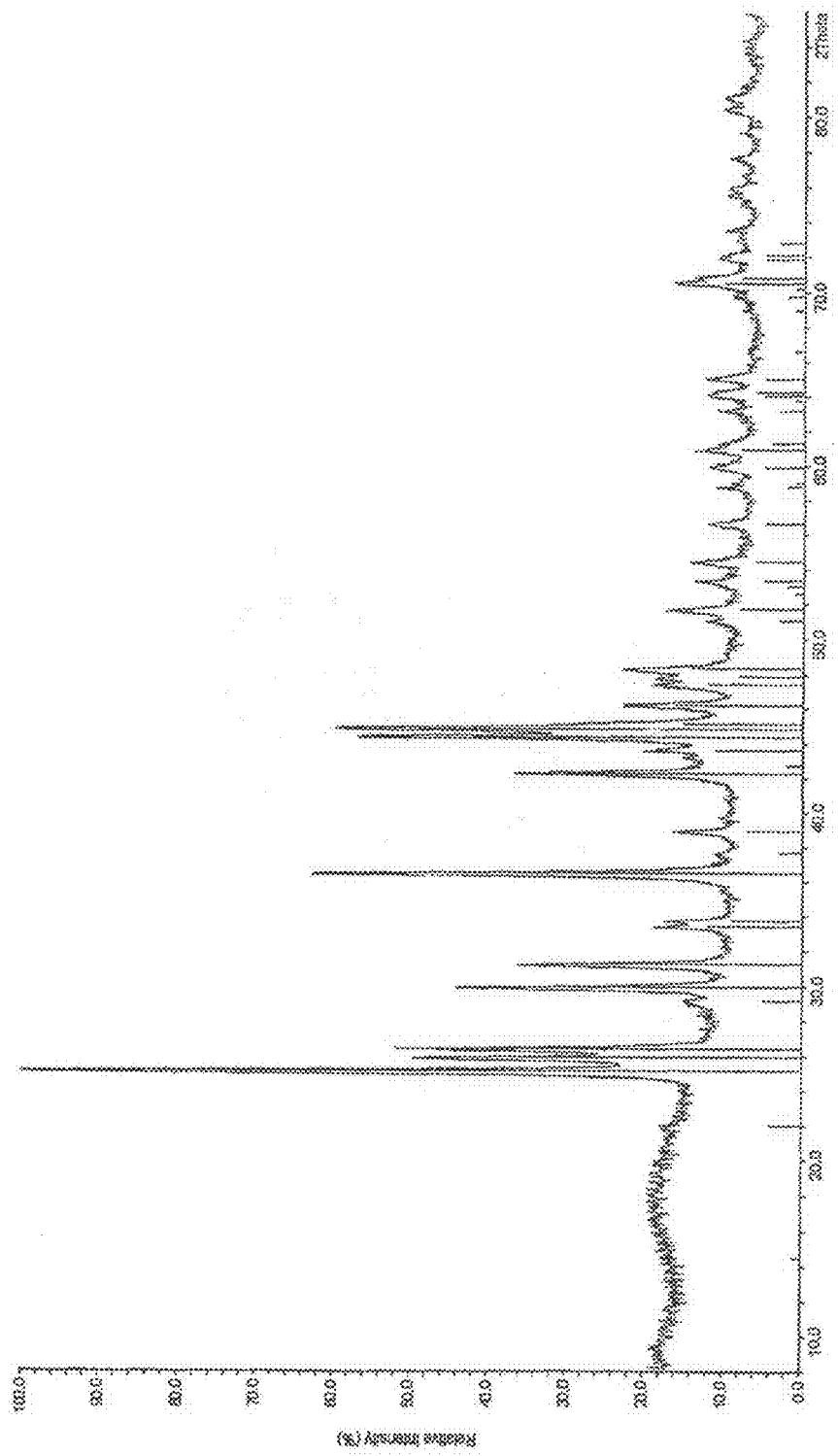
FIG. 13 shows an x-ray powder diagram of a quenched $Zn_4Sb_3$ sample made by a process in analogy with the prior art quench method.

In a preferred embodiment such "quenched" materials has the stoichiometric formula $Zn_4Sb_3$, wherein part of the Zn atoms optionally being substituted by one or more elements selected from the group comprising Mg and Pb in a total amount of 20 mol % or less in relation to the Zn atoms FIG. 13 is an x-ray powder diffraction diagram of a quenched $Zn_4Sb_3$ material which has not been zone refined (the continuous spectrum shows the measured data). The lines in the diagram correspond to the $Zn_4Sb_3$ phase and the correspondence between the lines and the continuous spectrum suggests that although the sample has not been zone refined it nevertheless comprises the correct $Zn_4Sb_3$ phase.

FIGS. 9a-9d show the effect on physical properties of zone refining (upper curve) and a quenched $Zn_4Sb_3$ material made by a process in analogy with the prior art quench method (lower curve). Both samples have been thermally cycled until constant values of properties were obtained. In respect of the thermal conductivity measurements the two curves are essentially superimposed. It is seen that zone refining process improves the thermoelectric properties of the material.

FIGS. 10-10b show the phase purity of a quenched $Zn_4Sb_3$ material which has been doped with 0.1 mol % cadmium. The sample was scanned along the lengthwise direction. Even though this material had not been zone refined, it exhibits excellent phase purity as evidenced by a width, w of 6.7 $\mu VK^{-1}$.

Figure 11:
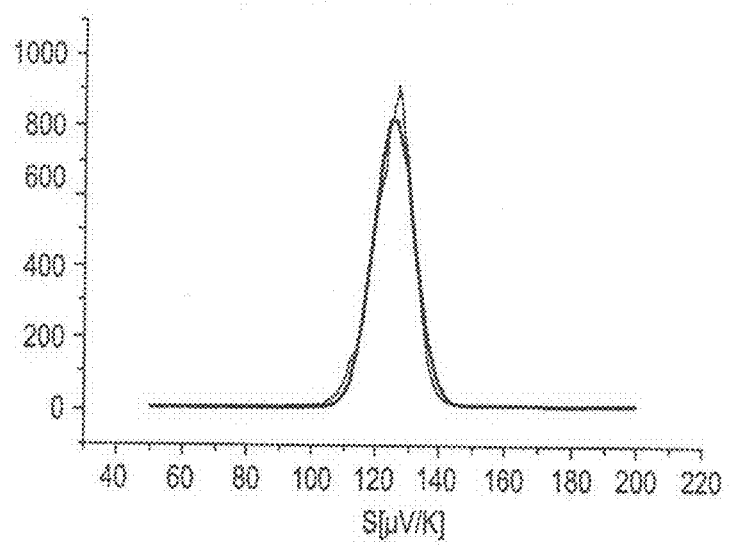
FIGS. 11-11b show the distribution of Seebeck coefficients of a quenched $Zn_4Sb_3$ sample doped with Mg.
Figure 11A:
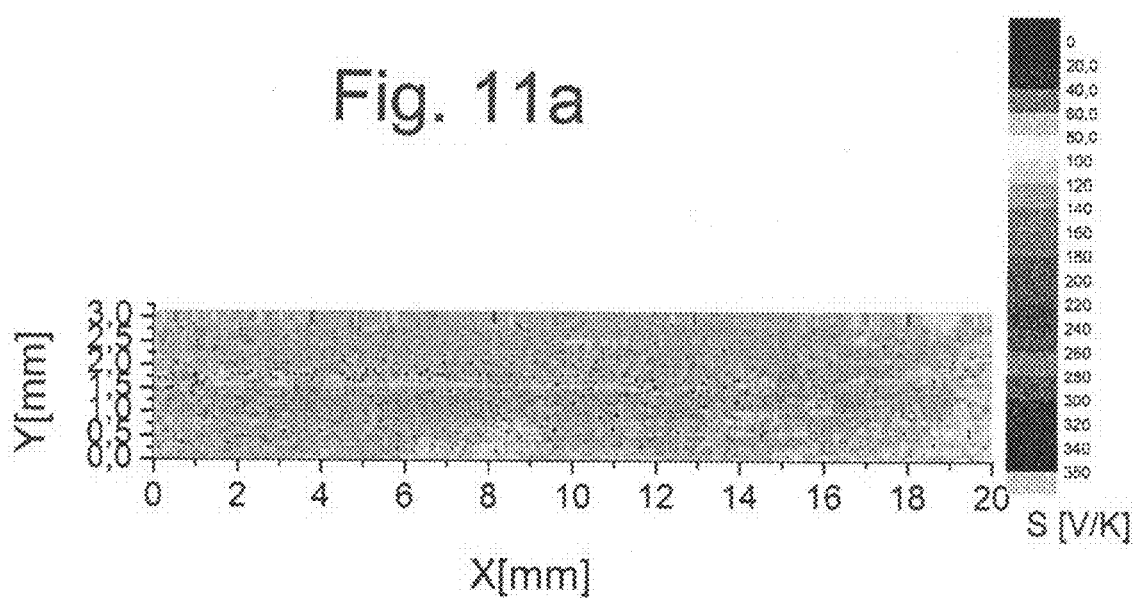

Similarly, FIGS. 11-11b shows the phase purity of a quenched $Zn_4Sb_3$ material which has been doped with 0.1 mol % magnesium. The sample was scanned along the lengthwise direction. Even though the material had not been zone refined, it exhibits an excellent phase purity expressed by the width, w of 12.0 $\mu VK^{-1}$.

C—Preparation of the "Non-Stoichiometric" Materials for Use in the Zone Melting Process According to one embodiment of the present invention, the "non-stoichiometric" materials may be obtained by mixing the appropriate amounts of Zn and Sb respectively, then placing this mixture in an enclosure, such as a quartz tube, evacuating and closing said enclosure thereby forming an ampoule and placing the obtained ampoule in a furnace, such as a tube furnace, whereafter the material is sintered.

The mixing of the components is preferably performed by rotating the component Zn and Sb in a flask for approximately 1 hour.

Preferably the mixture is sintered for approximately six hours. More preferred the material is sintered for more than approximately 12 hours. It appears that a longer sintering time results in a better mechanical stability of the "non-stoichiometric" material. The sintering temperature is suitably selected in the range of 400-550° C., such as approximately 400-450° C.

When sintering is completed the ampoule is broken and the material is used as is.

The molar ratio Zn to Sb for the "non-stoichiometric" composition is preferably in the range 57:43 to 51:49, such as 56:44 to 52:48, for example 55:45 to 53:47 such as 54:46. The most preferred molar ratio Zn to Sb for the "non-stoichiometric" composition is approximately 52:48.

The enclosure containing the "non-stoichiometric" composition is preferably evacuated to a final pressure of $10^{-5}$ bar or less, or $10^{-3}$ bar or less.

The above inventive process presents an easy and time efficient way to the manufacture of the improved thermoelectric materials according to the present invention. As revealed by a spatial Seebeck scanning the obtained inventive materials having the $Zn_4Sb_3$ type structure exhibit a single, sharp peak indicating a high degree of phase purity (cf. FIG. 5, FIG. 6, FIG. 10 and FIG. 11. Furthermore, the thermoelectric materials according to the present invention exhibiting a single peak in said spatial Seebeck scanning have been shown to have a $Zn_4Sb_3$ type structure (cf. FIG. 13, FIG. 14 and FIG. 16), And finally, as evidenced by FIGS. 12 and 15, the thermoelectric materials according to the present invention have excellent thermoelectric properties.

Preferably the thermoelectric materials of the p-type having the stoichiometric formula $Zn_4Sb_3$, wherein part of the Zn atoms optionally being substituted by one or more elements selected from the group comprising Sn, Mg, Pb and the transition metals in a total amount of 20 mol % or less in relation to the Zn atoms according to the present invention prior to thermal cycling have a ZT at 375° C. of 1.3 or more, such as 1.4 or more, for example 1.5 or more; or 1.6 or more, such as 1.7 or more.

The thermoelectric material of the above type having the stoichiometric formula $Zn_4Sb_3$ according to the present invention prior to thermal cycling preferably have a ZT at 400° C. of 1.4 or more, such as 1.5 or more, for example 1.6 or more, such as 1.7 or more.

When subjected to thermal cycling the thermoelectric materials of the p-type having the stoichiometric formula $Zn_4Sb_3$, wherein part of the Zn atoms optionally being substituted by one or more elements selected from the group comprising Sn, Mg, Pb and the transition metals in a total amount of 20 mol % or less in relation to the Zn atoms according to the present invention preferably have a ZT at 350° C. of 0.4 or more, such as 0.5 or more, for example 0.6 or more, such as 0.7 or more; or 0.8 or more, such as 0.9 or more, e.g. 1.0 or more.

The thermoelectric materials of the p-type having the stoichiometric formula $Zn_4Sb_3$, wherein part of the Zn atoms optionally being substituted by one or more elements selected from the group comprising Sn, Mg, Pb and the transition metals in a total amount of 20 mol % or less in relation to the Zn atoms according to the present invention after thermal cycling preferably have a ZT at 400° C. of 0.5 or more, such as 0.6 or more, for example 0.7 or more, such as 0.8 or more;

or 0.9 or more, such as 1.0 or more, e.g. 1.1 or 1.2 or more; for example 1.3 or more, such as 1.4 or more.

The Zone Melting Process in a General Perspective

In a general perspective the zone melting process may be applied in the phase refining of an already existing thermoelectric material showing a peritectic reaction analogue to $Zn_4Sb_3$.

Hence, the zone melting process may also be applied in situations in which an improved purity of an already existing thermoelectric material is desired. In this case, the already existing thermoelectric material is simply used as "feeding rod(s)" as generally described above and the already existing thermoelectric material is then subjected to the zone refining process.

In order to be able to determine a suitable composition of the "non-stoichiometric" material to be used in the zone melting process in such a situation, the phase diagram of the composition of the material of the "feeding rod" should be consulted.

Figure 18:
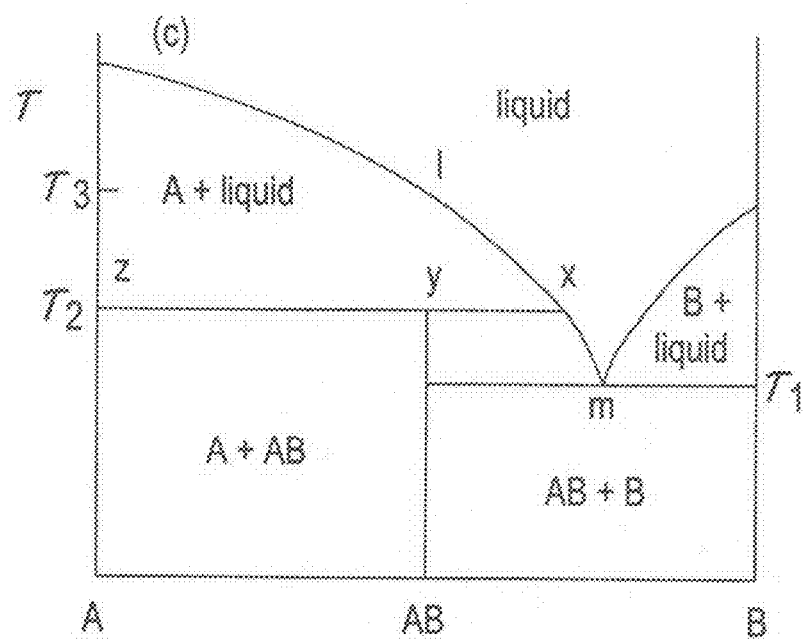
FIG. 18 shows the phase diagram of a material having the composition AB and having a phase diagram showing a peritectic reaction.

FIG. 18 shows a phase diagram of a material having a binary composition (of element A and element B) and showing a peritectic reaction analogue to $Zn_4Sb_3$. The x-axis represents the composition ranging (from left to right) from pure A to pure B. The y-axis represent the temperature.

The composition of the material of the "non-stoichiometric" rod should be selected so as to correspond to the projection of the liquidus curve "x-m" of FIG. 18 on the composition axis (the x-axis).

In the case where the thermoelectric material is a tertiary material (a material composed of three elements), the phase diagram is three-dimensional, and the projection of the liquidus curve "x-m" will be a two-dimensional surface, etc.

A person skilled in the art will be able to obtain information of the composition corresponding to a "liquidus" curve for any given thermoelectric material showing a peritectic reaction In a preferred embodiment according to the present invention the zone melting process according to the present invention is performed on an already existing thermoelectric material having the composition $CoSb_3$ or $FeSb_2$. The phase diagram of these thermoelectric materials can be found in M. Hansen, "The constitution of binary alloys", McGraw-Hill Book Company, New York, 1958; and R. D. Elliot, "The constitution of binary alloys, first supplement", McGraw-Hill, Inc. New York, 1965.

The Manufacture of a Thermocouple

In a special embodiment according to the present invention the obtained thermoelectric material is used as the p-type thermoelectric in a thermocouple. By cutting this p-type material in suitable sizes and arranging and connecting such a piece of the appropriate size together with an n-type thermoelectric material, a thermocouple is obtained in a way known per se. See for example "Frank Benhard; Technische Temperaturmessung; Springer Berlin, 2003; ISBN 3540626727".

The Manufacture of a Thermoelectric Device Comprising One or More Thermocouples

In a special embodiment according to the present invention one or more of the obtained thermocouples is/are arranged in a way known per se in order to obtain a thermoelectric device. See for example "Frank Benhard; Technische Temperaturmessung; Springer Berlin, 2003; ISBN 3540626727".

Use of the Thermoelectric Device for Thermoelectric Purposes

In another aspect according to the present invention the obtained thermoelectric device is used for thermoelectric purposes.

Such uses are well-known for a person skilled in the art of thermoelectrics.

EXAMPLES

In the following examples the chemicals used were:
Zn, 3-8 mm pellets (Merck 8780);
Sb 325 mesh 99.5% (Alfa Caesar 10099);
Mg "shavings" 99.98% Alfa Caesar 36193
Cd, "shavings", 99.999% Cominco, Canada
Pb, granules, BDH 29014
Hg, superpur, Merck 4404
Sn, granules, 4 mm, Merck 7806

Example 1

Synthesis of a $Zn_4Sb_3$ Thermoelectric Material by Thermal Quenching in Analogy to the Prior Art Quench Method Small pellets of Zn were cleaned a few seconds in 4M HCl, and subsequently rinsed first in water and then in ethanol. They were dried with a hair dryer. The Zn pellets were then weighed ($M_{Zn}$=22.83638 g), and placed in a quartz tube (inner diameter=12.5 mm, outer diameter=15 mm). Additionally, antimony was added ($M_{Sb}$=31.89701 g). The tube was evacuated to $10^{-5}$ bar and closed by melting resulting in a quartz ampoule.

This ampoule was placed in a rotation device inside a tube furnace (HEREUS, ROK/A 6/30), and it was rotated consistently during heating so as to ensure mixing and homogenous heating. It was heated from room temperature to 700° C. at 400° C./h. After 2 hours the ampoule was quickly placed in a water container for thermal quenching, thereby obtaining a rod.

FIGS. 9a-9d show physical data measured on the $Zn_4Sb_3$ material which has not been zone refined (the quenched material)—the lower curve. The sample has been thermally cycled until constant values of properties were obtained.

FIG. 13 is an x-ray powder diffraction diagram of quenched $Zn_4Sb_3$ material (the continuous spectrum shows the measured data). The lines in the diagram correspond to the $Zn_4Sb_3$ phase and correspondence between the lines and the continuous spectrum suggests that it comprises the correct $Zn_4Sb_3$ phase.

Example 2

Preparation of Mg-Doped Thermoelectric Materials

A range of different Mg-doped materials was made.
Following the procedure described in example 1 with the exception of substituting part of the Zn with Mg: $M_{Zn}$=7.05042 g, $M_{Mg}$=0.05406 g, $M_{Sb}$=10.04673 g, a 2% Mg-doped thermoelectric material is obtained.

Similarly, a 0.1% Mg doped $Zn_4Sb_3$ material was made. FIG. 11 shows the phase purity of this thermoelectric material expressed by the distribution of Seebeck values. The sample was scanned along the lengthwise direction. Even though this material had not been zone refined, it exhibits a phase purity expressed by w of 12.0 $\mu VK^{-1}$.

Example 3

Preparation of Cd-Doped Thermoelectric Materials

Following the procedure described in example 1 with the exception of substituting part of the Zn with Cd:

$M_{Zn}$=4.13008 g, $M_{Cd}$=0.07172 g, $M_{Sb}$=5.82651 g, a 1% Cd-doped thermoelectric material is obtained.

Similarly, a 0.1% Cd doped $Zn_4Sb_3$ material was made. FIG. 10 shows the phase purity of this thermoelectric material expressed by the distribution of Seebeck values. The sample was scanned along the lengthwise direction. Even though this material had not been zone refined, it exhibits a phase purity expressed by w of 6.7 $\mu VK^{-1}$.

Example 4

Preparation of a 1% Hg-Doped Thermoelectric Material

Following the procedure described in example 1 with the exception of substituting part of the Zn with Hg: $M_{Zn}$=9.74857 g, $M_{Hg}$=0.302 g, $M_{Sb}$=13.74376 g, a Hg-doped thermoelectric material is obtained.

Example 5

Preparation of a 1% Pb-Doped Thermoelectric Material

Following the procedure described in example 1 with the exception of substituting part of the Zn with Pb: $M_{Zn}$=4.16204 g, $M_{Pb}$=0.13998 g, $M_{Sb}$=5.87129 g, a Pb-doped thermoelectric material is obtained.

Example 6

Preparation of a 1% Sn-Doped Thermoelectric Material

Following the procedure described in example 1 with the exception of substituting part of the Zn with Sn: $M_{Zn}$=2.0523 g, $M_{Sn}$=0.0366 g, $M_{Sb}$=2.8981 g, a Sn-doped thermoelectric material is obtained.

Example 7

Preparation of a 1% Mg and 1% Cd-Doped Thermoelectric Material

Following the procedure described in example 1 with the exceptions of substituting part of the Zn with Mg and Cd: $M_{Zn}$=8.43497 g, $M_{Cd}$=0.14284 g, $M_{Mg}$=0.03421 g, $M_{Sb}$=12.02077 g, a Mg- and Cd-doped thermoelectric material is obtained.

Example 8

Synthesis of a $Zn_4Sb_3$ Thermoelectric Material by Zone Refinement

A—Synthesis of a "Non-Stoichiometric" Material

Zn and Sb was weighed in desired stoichiometry of 52 mol % Zn and 48 mol % Sb and mixed by rotation for about 1 hour ($M_{Zn}$=16.19581 g, $M_{Sb}$=27.84659 g) The mixture was subsequently placed in a quartz tube having same inner diameter as the rod obtained in example 1. The tube was evacuated to $10^{-5}$ bar and closed by melting. The resulting ampoule was placed in a vertical tube furnace (HEREUS ROK/A 6/30) where it is sintered for 12 hours at 400° C. and 14 hours at 450° C.

B—Zone Melting

In a quartz tube designed for mounting in an induction furnace 18 mm of a rod obtained in example 1 (a "feeding rod") was placed at the bottom. A 10 mm piece of the sintered "non-stoichiometric" material obtained as described above was placed on top. Finally a large "feeding rod", 70 mm, also prepared according to example 1 was placed on top of the "non-stoichiometric" rod. The quartz tube was closed by melting a piece of glass at the upper part, which allows mounting on a vacuum pump. The tube was evacuated to $10^{-5}$ bar and closed by melting. The quartz ampoule was placed in a boron nitride (BN) holder at the bottom of the induction furnace (TSS model HP crystal growing furnace, 60 kW max power). The top of the ampoule was fastened inside another BN mount, which was screwed into the pulling stick of the furnace. The ampoule was placed with the induction coil positioned around the "non-stoichiometric" rod, i.e. this is where the melt zone starts. The coil had three "windings" or coils in an overall conical shape. The top was 38 mm wide, the bottom 20 mm wide. Each coil was 5 mm thick. Heating was started and melting was observed in about 15 min., and the power was lowered slightly over 10 minutes. The power input was approximately 3.5 kW (2.5 kV, 1.4 A). After another 10 minutes the ampoule was pulled through the induction coils at a rate of 1.2 mm per hour. The melted zone travelled through the coils with the same speed, and the entire synthesis took 73 hours and 25 minutes. Subsequently the zone-refined $Zn_4Sb_3$ material was ball-milled under hexane and hot pressed at 100 MPa, 370° C. and 30 min under an inert atmosphere of 500 hPa nitrogen.

FIG. 5 shows the phase purity of this thermoelectric material expressed by the distribution of Seebeck values. The sample was scanned along the lengthwise direction. The material exhibits a phase purity expressed by w of 13.7 $\mu VK^{-1}$.

FIG. 15 shows physical data measured on the $Zn_4Sb_3$ material which has been zone refined The measurements took place before thermally cycling. At approximately 400° C. the ZT-value is above 1.1.

FIG. 9 shows physical data measured on a $Zn_4Sb_3$ material which has not been zone refined (a quenched material); and a zone refined $Zn_4Sb_3$ material according to the present invention respectively. The upper curve corresponds to the zone refined material. Both samples have been thermally cycled until constant values of properties were obtained. In respect of the thermal conductivity measurements the two curves are essentially superimposed. FIG. 9 shows that zone refining enhances the figure of merit, ZT. At 350° C. the ZT-value is increased from 0.4 without zone refining to 0.675 when zone refined which corresponds to an increase of approximately 68%.

FIG. 14 is an x-ray powder diffraction diagram of the zone refined $Zn_4Sb_3$ material (the continuous spectrum shows the measured data). The lines in the diagram correspond to the $Zn_4Sb_3$ phase and correspondence between the lines and the continuous spectrum suggests it comprises the correct $Zn_4Sb_3$ phase.

Example 9

Synthesis of a Mg-Doped $Zn_4Sb_3$ Thermoelectric Material by Zone Melting

Following the procedure described in example 8 with the exceptions of substituting part of the Zn with Mg: $M_{Zn}$=29.64571, $M_{Mg}$=0.11071 g, $M_{Sb}$=41.83186 g, a Mg-doped "feeding rod" was obtained.

Figure 16:
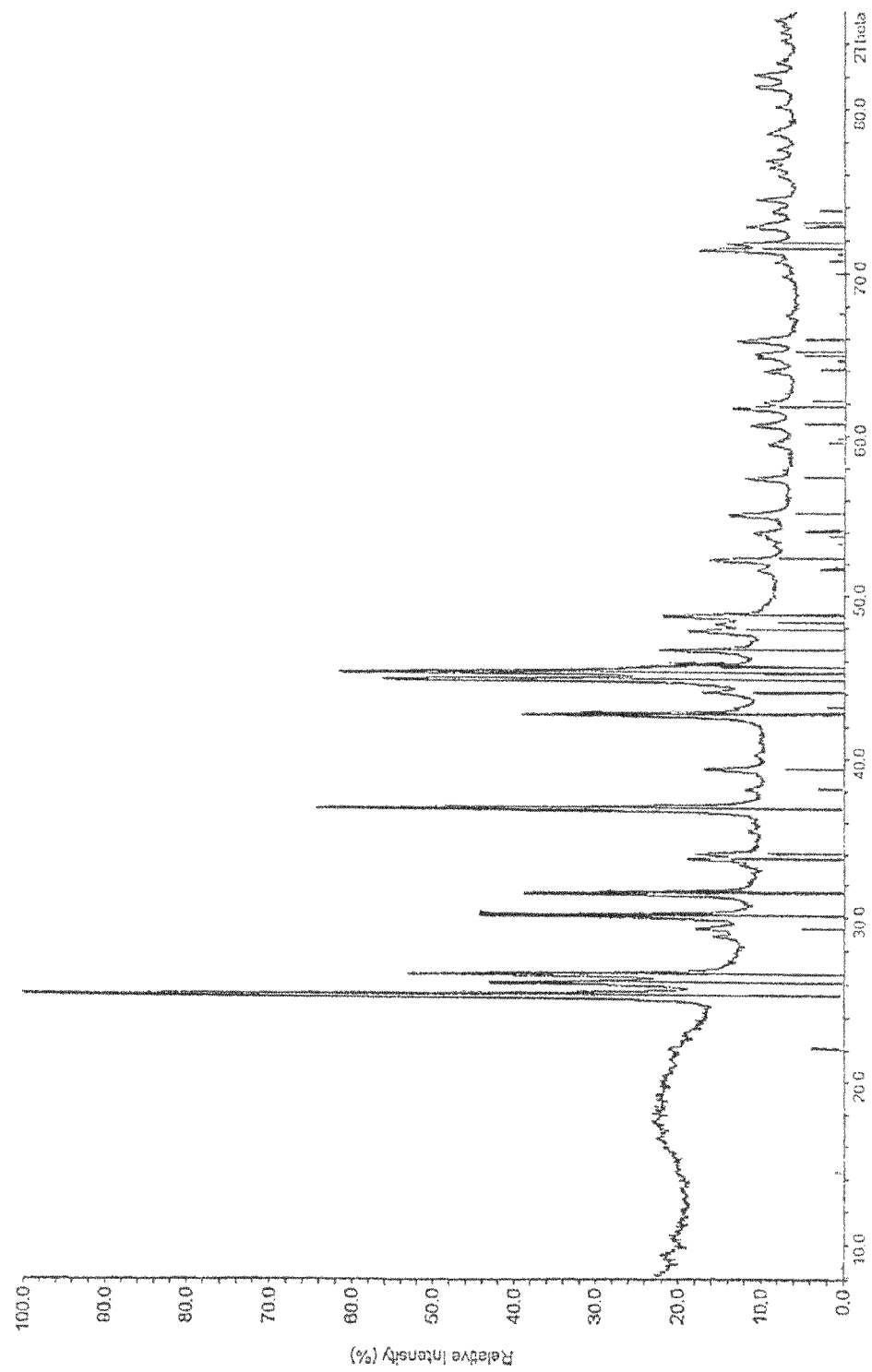
FIG. 16 shows an x-ray powder diagram of a zone refined Mg-doped $Zn_4Sb_3$ sample.

FIG. 6 shows the phase purity of this thermoelectric material expressed by the distribution of Seebeck values. The sample was scanned along the lengthwise direction. The thermoelectric material exhibits a phase purity expressed by w of 5.7 µVK$^{-1}$. FIG. 16 is an x-ray powder diffraction diagram of the zone refined Mg-doped $Zn_4Sb_3$ material (the continuous spectrum shows the measured data). The lines in the diagram correspond to the $Zn_4Sb_3$ phase and correspondence between the lines and the continuous spectrum suggests it comprises the correct $Zn_4Sb_3$ phase.

What is claimed is:

1. A thermoelectric material of the p-type having the stoichiometric formula $Zn_4Sb_3$, wherein part of the Zn atoms are substituted by Mg in a total amount of 20 mol % or less in relation to the Zn atoms.

2. The thermoelectric material according to claim 1, wherein said material in respect of ZT quality as expressed by the figure of merit, ZT, being stable after thermal cycling; and wherein said material exhibits a figure of merit, ZT of 0.5 or higher at 350° C. and/or of 0.6 or higher at 400° C.; said thermal cycling comprising repeatedly subjecting the material to consecutive temperature increases and decreases within the temperature range of 50-350° C.

3. The thermoelectric material according to claim 1, wherein said material at 350° C. exhibits a figure of merit, ZT of 0.6 or higher and/or wherein said material at 400° C. exhibits a figure of merit, ZT of 0.7 or higher.

4. The thermoelectric material according to claim 1, wherein the total amount of substitution of the Zn atoms is 18 mol % or less.

5. The thermoelectric material according to claim 1, wherein the total amount of substitution of the Zn atoms is 16 mol % or less.

6. The thermoelectric material according to claim 1, wherein the total amount of substitution of the Zn atoms is 14 mol % or less.

7. The thermoelectric material according to claim 1, wherein the total amount of substitution of the Zn atoms is 12 mol % or less.

8. The thermoelectric material according to claim 1, wherein the total amount of substitution of the Zn atoms is 10 mol % or less.

9. The thermoelectric material according to claim 1, wherein the total amount of substitution of the Zn atoms is 8 mol % or less.

10. The thermoelectric material according to claim 1, wherein the total amount of substitution of the Zn atoms is 6 mol % or less.

11. The thermoelectric material according to claim 1, wherein the total amount of substitution of the Zn atoms is 4 mol % or less.

12. The thermoelectric material according to claim 1, wherein the total amount of substitution of the Zn atoms is 2 mol % or less.

13. The thermoelectric material according to claim 1, wherein said material exhibits a single peak in a spatial Seebeck microprobe scan; and wherein said material has a homogeneity of 15 µVK−1 or less as expressed by the width, w of said peak at maximum S/√e of the best fitted curve of said spatial Seebeck microprobe scan.

14. The thermoelectric material according to claim 13, wherein said material has a homogeneity of 13 µVK−1 or less as expressed by said width, w of the peak at maximum S/√e of the best fitted curve of said spatial Seebeck microprobe scan.

15. The thermoelectric material according to claim 13, wherein said single peak corresponds to S≧90 µVK−1.

16. A thermocouple comprising one or more p-type thermoelectric materials according to claim 1.

17. A thermoelectric device comprising one or more thermocouples according to claim 16.

* * * * *